(12) United States Patent
Miles et al.

(10) Patent No.: US 7,518,775 B2
(45) Date of Patent: Apr. 14, 2009

(54) METHOD AND SYSTEM FOR PACKAGING A MEMS DEVICE

(75) Inventors: Mark W. Miles, San Francisco, CA (US); Jeffrey B. Sampsell, Pueblo West, CO (US)

(73) Assignee: IDC, LLC, Pleasanton, CA (US)

( * ) Notice: Subject to any disclaimer, the term of this patent is extended or adjusted under 35 U.S.C. 154(b) by 3 days.

(21) Appl. No.: 11/679,134

(22) Filed: Feb. 26, 2007

(65) Prior Publication Data

US 2007/0247693 A1    Oct. 25, 2007

Related U.S. Application Data

(62) Division of application No. 11/045,800, filed on Jan. 28, 2005, now Pat. No. 7,184,202.

(60) Provisional application No. 60/613,275, filed on Sep. 27, 2004, provisional application No. 60/613,493, filed on Sep. 27, 2004, provisional application No. 60/613,477, filed on Sep. 27, 2004, provisional application No. 60/613,489, filed on Sep. 27, 2004.

(51) Int. Cl.
    *G02B 26/00*    (2006.01)

(52) U.S. Cl. .................................... 359/238

(58) Field of Classification Search ................ 359/238, 359/290–295, 260, 298, 489, 497, 580, 599; 257/431, 432, 433, 434, 680, 682, 689, 737, 257/738, 777, 778, 779, 780; 438/53, 109, 438/125, 116; 362/300, 241, 479, 483, 517, 362/560

See application file for complete search history.

(56) References Cited

U.S. PATENT DOCUMENTS 4,074,480 A     2/1978   Burton
4,310,220 A     1/1982   Kuwagaki et al.
4,383,255 A     5/1983   Grandjean et al.
4,459,182 A     7/1984   te Velde
4,956,619 A     9/1990   Hornbeck (Continued)

FOREIGN PATENT DOCUMENTS

| EP | 0 667 548 | 8/1995 |
|----|-----------|--------|
| EP | 0 695 959 | 2/1996 |
| EP | 0 822 570 | 2/1998 |
| EP | 1418154 A2 | 5/2004 |
| EP | 1 433 742 | 6/2004 |

(Continued)

OTHER PUBLICATIONS

Miles, MEMS-based interferometric modulator for display applications, Proceedings of the SPIE, Micromachined Devices and Components V, Sep. 1999, pp. 20-28.

(Continued)

*Primary Examiner*—Hung X Dang
*Assistant Examiner*—Tuyen Q Tra
(74) *Attorney, Agent, or Firm*—Knobbe, Martens, Olson & Bear LLP

(57) ABSTRACT

A MEMS-based display device is described, wherein an array of interferometric modulators are configured to reflect light through a transparent substrate. The transparent substrate is sealed to a backplate and the backplate can contain electronic circuitry for controlling the array of interferometric modulators. The backplate can provide physical support for device components, such as electronic components which can be used to control the state of the display. The backplate can also be utilized as a primary structural support for the device.

30 Claims, 12 Drawing Sheets

U.S. PATENT DOCUMENTS

| | | |
|---|---|---|
| 5,018,256 A | 5/1991 | Hornbeck |
| 5,099,353 A | 3/1992 | Hornbeck |
| 5,216,537 A | 6/1993 | Hornbeck |
| 5,244,707 A | 9/1993 | Shores |
| 5,268,533 A | 12/1993 | Kovacs et al. |
| 5,331,454 A | 7/1994 | Hornbeck |
| 5,401,983 A | 3/1995 | Jokerst et al. |
| 5,717,476 A | 2/1998 | Kanezawa |
| 5,771,321 A | 6/1998 | Stern |
| 5,784,189 A | 7/1998 | Bozler et al. |
| 5,835,255 A | 11/1998 | Miles |
| 5,853,662 A | 12/1998 | Watanabe |
| 5,856,820 A | 1/1999 | Weigers et al. |
| 5,936,758 A | 8/1999 | Fisher et al. |
| 5,939,785 A | 8/1999 | Klonis et al. |
| 5,959,763 A | 9/1999 | Bozler et al. |
| 5,986,796 A | 11/1999 | Miles |
| 5,999,306 A | 12/1999 | Atobe et al. |
| 6,040,937 A | 3/2000 | Miles |
| 6,055,090 A | 4/2000 | Miles |
| 6,107,115 A | 8/2000 | Atobe et al. |
| 6,120,339 A | 9/2000 | Alwan |
| 6,127,765 A | 10/2000 | Fushinobu |
| 6,195,196 B1 | 2/2001 | Kimura et al. |
| 6,238,755 B1 | 5/2001 | Harvey et al. |
| 6,303,986 B1 | 10/2001 | Shook |
| 6,365,229 B1 | 4/2002 | Robbins |
| 6,379,988 B1 | 4/2002 | Peterson et al. |
| 6,384,473 B1 | 5/2002 | Peterson et al. |
| 6,426,124 B2 | 7/2002 | Olster et al. |
| 6,426,461 B1 | 7/2002 | Ginter et al. |
| 6,447,126 B1 | 9/2002 | Hornbeck |
| 6,455,927 B1 | 9/2002 | Glenn et al. |
| 6,462,392 B1 | 10/2002 | Pinter et al. |
| 6,465,355 B1 | 10/2002 | Horsley |
| 6,466,354 B1 | 10/2002 | Gudeman |
| 6,472,739 B1 | 10/2002 | Wood et al. |
| 6,489,670 B1 | 12/2002 | Peterson et al. |
| 6,495,895 B1 | 12/2002 | Peterson et al. |
| 6,525,416 B2 | 2/2003 | Hauser et al. |
| 6,538,312 B1 | 3/2003 | Peterson et al. |
| 6,558,820 B2 | 5/2003 | Raychaudhuri et al. |
| 6,583,921 B2 | 6/2003 | Nelson |
| 6,589,625 B1 | 7/2003 | Kothari et al. |
| 6,603,182 B1 | 8/2003 | Low et al. |
| 6,650,455 B2 | 11/2003 | Miles |
| 6,661,084 B1 | 12/2003 | Peterson et al. |
| 6,674,159 B1 | 1/2004 | Peterson et al. |
| 6,674,562 B1 | 1/2004 | Miles |
| 6,680,792 B2 | 1/2004 | Miles |
| 6,690,444 B1 | 2/2004 | Wilkinson et al. |
| 6,778,046 B2 | 8/2004 | Stafford et al. |
| 6,779,260 B1 | 8/2004 | Brandenburg et al. |
| 6,843,936 B1 | 1/2005 | Jacobs |
| 6,867,896 B2 | 3/2005 | Miles |
| 6,882,458 B2 | 4/2005 | Lin et al. |
| 6,882,480 B2 | 4/2005 | Yanagisawa |
| 6,922,499 B2 | 7/2005 | Boie et al. |
| 6,947,200 B2 | 9/2005 | Huibers |
| 6,995,890 B2 | 2/2006 | Lin |
| 6,999,225 B2 | 2/2006 | Lin et al. |
| 7,015,885 B2 | 3/2006 | Novotny et al. |
| 7,019,458 B2 | 3/2006 | Yoneda |
| 7,034,984 B2 | 4/2006 | Pan et al. |
| 7,042,643 B2 | 5/2006 | Miles |
| 7,046,374 B1 * | 5/2006 | Barbarossa .................. 356/519 |
| 7,060,895 B2 | 6/2006 | Kothari et al. |
| 7,123,216 B1 | 10/2006 | Miles |
| 7,126,741 B2 | 10/2006 | Wagner et al. |
| 7,161,728 B2 | 1/2007 | Sampsell et al. |
| 7,164,520 B2 | 1/2007 | Palmateer et al. |
| 2001/0004085 A1 | 6/2001 | Gueissaz |
| 2001/0055146 A1 | 12/2001 | Atobe et al. |
| 2002/0012364 A1 | 1/2002 | Kalian et al. |
| 2002/0024711 A1 | 2/2002 | Miles |
| 2002/0043706 A1 | 4/2002 | Jerominek et al. |
| 2002/0052392 A1 | 5/2002 | Day et al. |
| 2002/0054424 A1 | 5/2002 | Miles |
| 2002/0056898 A1 | 5/2002 | Lopes et al. |
| 2002/0056900 A1 | 5/2002 | Liu et al. |
| 2002/0070931 A1 | 6/2002 | Ishikawa |
| 2002/0075551 A1 | 6/2002 | Daneman |
| 2002/0075555 A1 | 6/2002 | Miles |
| 2002/0126364 A1 | 9/2002 | Miles |
| 2002/0160583 A1 | 10/2002 | Song |
| 2002/0187254 A1 | 12/2002 | Ghosh |
| 2003/0043157 A1 | 3/2003 | Miles |
| 2003/0054588 A1 | 3/2003 | Patel et al. |
| 2003/0062186 A1 | 4/2003 | Boroson et al. |
| 2003/0072070 A1 | 4/2003 | Miles |
| 2003/0075794 A1 | 4/2003 | Felton et al. |
| 2003/0108306 A1 | 6/2003 | Whitney et al. |
| 2003/0144034 A1 | 7/2003 | Hack et al. |
| 2003/0152872 A1 | 8/2003 | Miles |
| 2003/0161126 A1 | 8/2003 | Wilkinson et al. |
| 2003/0183916 A1 | 10/2003 | Heck et al. |
| 2003/0184412 A1 | 10/2003 | Gorrell |
| 2004/0051929 A1 | 3/2004 | Sampsell et al. |
| 2004/0061492 A1 | 4/2004 | Lopes et al. |
| 2004/0076008 A1 | 4/2004 | Ikeda |
| 2004/0100677 A1 | 5/2004 | Huibers et al. |
| 2004/0140557 A1 | 7/2004 | Sun et al. |
| 2004/0163472 A1 | 8/2004 | Nagahara |
| 2004/0173886 A1 | 9/2004 | Carley |
| 2004/0183990 A1 | 9/2004 | Guang et al. |
| 2004/0184133 A1 | 9/2004 | Su et al. |
| 2004/0218251 A1 | 11/2004 | Piehl et al. |
| 2005/0002079 A1 | 1/2005 | Novotny et al. |
| 2005/0035699 A1 | 2/2005 | Tsai |
| 2005/0036095 A1 | 2/2005 | Yeh et al. |
| 2005/0036192 A1 | 2/2005 | Lin et al. |
| 2005/0042117 A1 | 2/2005 | Lin |
| 2005/0046919 A1 | 3/2005 | Taguchi et al. |
| 2005/0074919 A1 | 4/2005 | Patel et al. |
| 2005/0093134 A1 | 5/2005 | Tam |
| 2005/0139940 A1 | 6/2005 | Patel et al. |
| 2005/0159028 A1 | 7/2005 | Sweetland et al. |
| 2005/0167795 A1 | 8/2005 | Higashi |
| 2005/0170540 A1 | 8/2005 | Patel et al. |
| 2005/0170547 A1 | 8/2005 | Patel et al. |
| 2005/0170557 A1 | 8/2005 | Patel et al. |
| 2005/0170614 A1 | 8/2005 | Patel et al. |
| 2005/0173711 A1 | 8/2005 | Patel et al. |
| 2005/0179982 A1 | 8/2005 | Patel et al. |
| 2005/0180686 A1 | 8/2005 | Patel et al. |
| 2005/0181532 A1 | 8/2005 | Patel et al. |
| 2005/0184304 A1 | 8/2005 | Gupta et al. |
| 2005/0191789 A1 | 9/2005 | Patel et al. |
| 2005/0191790 A1 | 9/2005 | Patel et al. |
| 2005/0195462 A1 | 9/2005 | Lin |
| 2005/0214976 A1 | 9/2005 | Patel et al. |
| 2005/0253283 A1 | 11/2005 | Dcamp et al. |
| 2005/0254982 A1 | 11/2005 | Cadeddu |
| 2005/0260792 A1 | 11/2005 | Patel et al. |
| 2005/0260793 A1 | 11/2005 | Patel et al. |
| 2006/0029732 A1 | 2/2006 | Kobrin et al. |
| 2006/0066935 A1 | 3/2006 | Cummings et al. |
| 2006/0148365 A1 | 7/2006 | Tsai |
| 2006/0274400 A1 | 12/2006 | Miles |
| 2007/0170568 A1 | 7/2007 | Chui et al. |

FOREIGN PATENT DOCUMENTS

| | | |
|---|---|---|
| FR | 2841380 | 12/2003 |

| | | |
|---|---|---|
| JP | 61-206244 | 9/1986 |
| JP | 63-162378 | 10/1988 |
| JP | 02-068513 | 3/1990 |
| JP | 03-199920 | 8/1991 |
| JP | 10-70287 | 3/1998 |
| JP | 11 337953 | 12/1999 |
| JP | 2001-318324 | 11/2001 |
| JP | 2001-351998 | 12/2001 |
| JP | 2002-062491 | 2/2002 |
| JP | 2002-062492 | 2/2002 |
| JP | 2002/062492 | 2/2002 |
| JP | 2002-258310 | 9/2002 |
| JP | 2002-328313 | 11/2002 |
| JP | 2002-357846 | 12/2002 |
| JP | 2003-075741 | 3/2003 |
| JP | 2003-233024 | 8/2003 |
| JP | 2003-330001 | 11/2003 |
| JP | 2004-053852 | 2/2004 |
| JP | 2004-78107 | 3/2004 |
| JP | 2004-118001 | 4/2004 |
| WO | WO 90/05795 | 5/1990 |
| WO | WO 95/01624 | 1/1995 |
| WO | WO 98/06118 | 2/1998 |
| WO | WO 99/41732 | 2/1999 |
| WO | WO 00/17695 | 3/2000 |
| WO | WO 01/58804 | 8/2001 |
| WO | WO 02/42716 A2 | 5/2002 |
| WO | WO 03/007049 A1 | 1/2003 |
| WO | WO 03/023849 | 3/2003 |
| WO | WO 03/026369 A1 | 3/2003 |
| WO | WO 03/054925 | 3/2003 |
| WO | WO 03/070625 | 8/2003 |
| WO | WO 03/084861 | 10/2003 |
| WO | WO 03/095706 | 11/2003 |
| WO | WO 03/105198 | 12/2003 |
| WO | WO 2004/077523 | 9/2004 |
| WO | WO 2005/110914 A1 | 11/2005 |
| WO | WO 2005/114294 A1 | 12/2005 |

OTHER PUBLICATIONS

Stark et al., An integrated process for post-packaging release and vacuum sealing of electroplated nickel packages, Transducers, 12th International Conference on Solid-State Sensors, Actuators and Microsystems, 2003, pp. 1911-1914.

Liang, Zhi-Hao et al., "A Low Temperature Wafer-Level Hermetic MEMS Package Using UV Curable Adhesive", Electronic Components and Technology Conference, 2004 IEEE, pp. 1486-1491.

Moraja, et al., Advanced Getter Solutions at Wafer Level to Assure High Reliability to the last Generations MEMS, IEEE Reliability Physics Symposium Proceedings, 2003, pp. 458-459.

Sparks, et al. Chip-Level Vacuum Packaging of Micromachines Using NanoGetters, IEEE Transactions on Advanced Packaging, vol. 26 Issue 3, Aug. 2003, pp. 277-282.

Office Action mailed Jun. 9, 2006 in U.S. Appl. No. 11/045,800.

Office Action mailed Mar. 16, 2007 in European App. No. 05255684.2.

European Search Report dated Jan. 5, 2006 in European Application No. 05255684.2.

Greco et al., Optical properties of IPN-like networks polyethylene/poly(butylmethacrylate-co-styrene copolymer systems, III. Influence of copolymer crosslinkers, Polymer 42 (2001), 5089-5095.

Office Action in Chinese App. No. 200510102594.8, dated Apr. 4, 2008.

Notice of Reasons for Rejection in Japanese App. No. 2005-211852, dated Jul. 14, 2008.

Tilmans et al., The indent reflow sealing (IRS) technique—A method for the fabrication of sealed cavities for mems devices, Journal of Microelectromechanical Systems, 9(2), Jun. 2000.

\* cited by examiner

| | Column Output Signals | |
|---|---|---|
| | $+V_{bias}$ | $-V_{bias}$ |
| Row Output Signals  0 | Stable | Stable |
| $+\Delta V$ | Release | Actuate |

METHOD AND SYSTEM FOR PACKAGING A MEMS DEVICE

CROSS-REFERENCES TO RELATED APPLICATIONS

This application is a divisional of U.S. patent application Ser. No. 11/045,800, filed on Jan. 28, 2005, now published as U.S. Publication No. 2006-0077533 A1, which claims priority under 35 U.S.C. § 119(e) to U.S. Provisional Application No. 60/613,275, filed on Sep. 27, 2004, to U.S. Provisional Application No. 60/613,493, filed on Sep. 27, 2004, to U.S. Provisional Application No. 60/613,477, filed on Sep. 27, 2004, and to U.S. Provisional Application No. 60/613,489, filed on Sep. 27, 2004, each of which is hereby incorporated by reference.

FIELD

The field of the invention relates to microelectromechanical systems (MEMS). Embodiments of the invention relate to micro-electro-mechanical systems (MEMS) and methods for packaging such systems. More specifically, the invention relates to packaging an interferometric modulator using a backplate that also holds electronic circuitry connected to the modulator.

BACKGROUND

Consumers generally desire that electronic products be as small and lightweight as possible. As flat panel displays grow in capability and widespread application, it is not unusual for the size of a product to be driven by the size of the display, with great pressure to make the rest of the product fit within a minimal volume. Two dimensions of that volume are frequently defined by the 2D footprint of the flat panel display. With the increasing desirability of product "thinness," it becomes increasingly desirable to make thinner layers, to combine layers, and/or to eliminate layers from the product. Examples of product layers include, but are not limited to, clear windows to protect the display, airgaps between the protective window and the display, frontlights in front of the display, touch screens, plastic films with optical functionalities, the display front glass, the active layers of the display, the display back glass, backlights behind the display, PC boards, plastic films carrying interconnections, and plastic and metal layers comprising the physical enclosure of the product.

The predominant display used in manufacturing handheld portable electronic devices is currently the Liquid Crystal Display (LCD). The principal layers of the LCD include a front glass, a back glass, and several plastic optical films. Due to the nature of an LCD, both the front plate and the back plate of the LCD serve as active or functional components of the LCD, placing limitations on the degree to which layers can be combined, eliminated, and/or replaced with a thinner layer in order to decrease the thickness of the overall display. In addition, the active nature of both plates of an LCD places limitations on the materials which can be used in those plates, and therefore the strength and durability of the plates. If additional strength and/or protection is required beyond what can be provided using materials suitable for the LCD plates, other layers of material may be required in addition to the LCD plates, potentially adding to the thickness, weight, and cost of the device.

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. An interferometric modulator may comprise a pair of conductive plates, one or both of which may be transparent and/or reflective in whole or part and capable of relative motion upon application of an appropriate electrical signal. One plate may comprise a stationary layer deposited on a substrate, the other plate may comprise a metallic membrane separated from the stationary layer by an air gap. Such devices have a wide range of applications, and it would be beneficial in the art to utilize and/or modify the characteristics of these types of devices so that their features can be exploited in improving existing products and creating new products that have not yet been developed.

SUMMARY

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

In one embodiment, for example, a display is provided, including a transparent substrate, an array of interferometric modulators configured to reflect light through said transparent substrate, a backplate sealed to the transparent substrate and providing a cavity for said interferometric modulators, and electronic circuitry located on the backplate and in electrical connection with the array of interferometric modulators.

In another embodiment, a device having a display is provided, including a transparent substrate, an array of interferometric modulators configured to reflect light through the transparent substrate, and a backplate sealed to the transparent substrate and providing a cavity for the interferometric modulators, wherein the backplate comprises electronic circuitry configured to control the interferometric modulators. In further embodiments, the backplane serves as a primary structural component of the display, and provides physical support for additional electronic circuitry configured to control the display.

In another embodiment, a method of manufacturing a display device is provided, including providing a transparent substrate comprising an array of interferometric modulators, providing a backplate comprising electronic circuitry configured to control the array of interferometric modulators, sealing the transparent substrate to the backplate so that a cavity is formed above the array of interferometric modulators, and wherein the electronic circuitry is placed in electrical communication with the array of interferometric modulators.

In another embodiment, a device is provided, the device being produced by the above method.

In another embodiment, a display is provided, including means for modulating light and reflecting it towards a viewer, a first means for supporting the modulating means, means for controlling the state of the modulation means, a second means for supporting the controlling means and providing a cavity for the modulating means.

In another embodiment, a display for an electronic device is provided, including a first transparent substrate, a first array of interferometric modulators configured to reflect light through the first transparent substrate and in a first direction, a backplate sealed to the first transparent substrate and providing a cavity for the first array of interferometric modulators, wherein the backplate comprises electronic circuitry configured to control the first array of interferometric modulators, and a second transparent substrate sealed to the backplate, wherein the second transparent substrate comprises a second array of interferometric modulators configured to reflect light in a second direction, and wherein the first direction and the second direction are opposite directions.

In another embodiment, a display for an electronic device is provided, including a first transparent substrate, a first array of interferometric modulators configured to reflect light through the first transparent substrate and in a first direction, a backplate sealed to the first transparent substrate and providing a cavity for the first array of interferometric modulators, wherein the backplate comprises electronic circuitry configured to control the first array of interferometric modulators, and a second transparent substrate sealed to the first backplane, wherein the second transparent substrate comprises a second array of interferometric modulators configured to reflect light in a second direction, and wherein the first direction and the second direction are opposite directions.

In another embodiment, a device having a display is provided, including a first transparent substrate, a first array of interferometric modulators configured to reflect light through said first transparent substrate, a second transparent substrate opposed to the first transparent substrate, and a second array of interferometric modulators configured to reflect light through the second transparent substrate.

In another embodiment, a method of manufacturing a display is provided, including providing a first transparent substrate comprising a first array of interferometric modulators, providing a second transparent substrate comprising a first array of interferometric modulators, providing a backplate comprising electronic circuitry configured to control the state of the first and second arrays of interferometric modulators, sealing the first transparent substrate to the backplate, sealing the second transparent substrate to the backplate, and placing the electronic circuitry in electrical connection with the first and second arrays of interferometric modulators. In another embodiment, a display is provided, the device being manufactured by the above method.

In another embodiment, a display is provided, the display including a first means for modulating light and reflecting it towards a viewer; a first means for supporting the first modulating means; a second means for modulating light and reflecting it towards a viewer; a second means for supporting the second modulating means, means for controlling the state of said first and second modulation means, and a third means for supporting said controlling means.

DETAILED DESCRIPTION OF PREFERRED EMBODIMENTS

Figure 1:
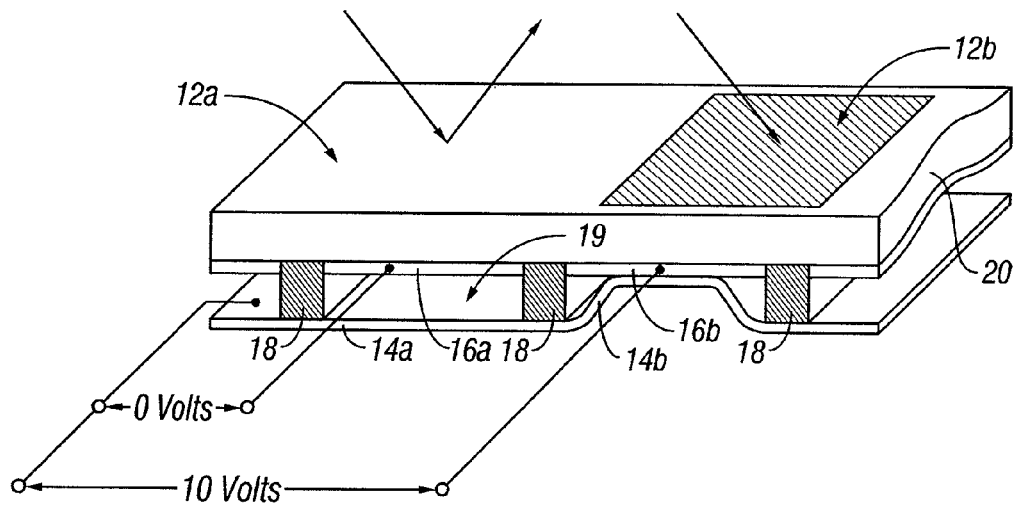
FIG. 1 is an isometric view depicting a portion of one embodiment of an interferometric modulator display in which a movable reflective layer of a first interferometric modulator is in a released position and a movable reflective layer of a second interferometric modulator is in an actuated position.

One embodiment of the invention is an interferometric modulator-based display, as discussed in greater detail below, wherein the backplate includes active components. Typically in an interferometric modulator, the backplate serves a purely mechanical function. Thus, fewer constraints are placed on the materials which can be used in the backplate, and there is greater freedom for layers to be combined, eliminated, and/or replaced with alternate or thinner layers. In particular, in this embodiment the backplate may be employed to hold electronic circuitry which controls the state of the interferometric modulator. For example, integrated circuits, such as display driver chips, may be mounted directly onto the backplate and then electrically connected to the interferometric modulator. The backplate can also be used to provide structural support for a device enclosing the display. The use of a backplate for multiple purposes advantageously permits the construction of an interferometric modulator-based display which may be thinner, stronger, easier to fabricate and/or less expensive than displays based on other technologies.

Another embodiment of the invention is an interferometric modulator-based display that has two opposed screens. The backplate of one display is used to form an interferometric modulator that faces in the opposite direction. This can be used, for example, in a cellular telephone that includes displays on opposite sides of the telephone. The use of the backplate to perform these functions advantageously permits the creation of dual-screen displays which are thinner, more rugged, and/or have a smaller footprint than other dual-screen displays.

The following detailed description is directed to certain specific embodiments of the invention. However, the invention can be embodied in a multitude of different ways. In this description, reference is made to the drawings wherein like parts are designated with like numerals throughout. As will be apparent from the following description, the invention may be implemented in any device that is configured to display an image, whether in motion (e.g., video) or stationary (e.g., still image), and whether textual or pictorial. More particularly, it is contemplated that the invention may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the released state, the movable layer is positioned at a relatively large distance from a fixed partially reflective layer. In the second position, the movable layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable and highly reflective layer 14a is illustrated in a released position at a predetermined distance from a fixed partially reflective layer 16a. In the interferometric modulator 12b on the right, the movable highly reflective layer 14b is illustrated in an actuated position adjacent to the fixed partially reflective layer 16b.

The fixed layers 16a, 16b are electrically conductive, partially transparent and partially reflective, and may be fabricated, for example, by depositing one or more layers each of chromium and indium-tin-oxide onto a transparent substrate 20. The layers are patterned into parallel strips, and may form row electrodes in a display device as described further below. The movable layers 14a, 14b may be formed as a series of parallel strips of a deposited metal layer or layers (orthogonal to the row electrodes 16a, 16b) deposited on top of posts 18 and an intervening sacrificial material deposited between the posts 18. When the sacrificial material is etched away, the deformable metal layers are separated from the fixed metal layers by a defined air gap 19. A highly conductive and reflective material such as aluminum may be used for the deformable layers, and these strips may form column electrodes in a display device.

With no applied voltage, the cavity 19 remains between the layers 14a, 16a and the deformable layer is in a mechanically relaxed state as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable layer is deformed and is forced against the fixed layer (a dielectric material which is not illustrated in this Figure may be deposited on the fixed layer to prevent shorting and control the separation distance) as illustrated by the pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

Figure 2:
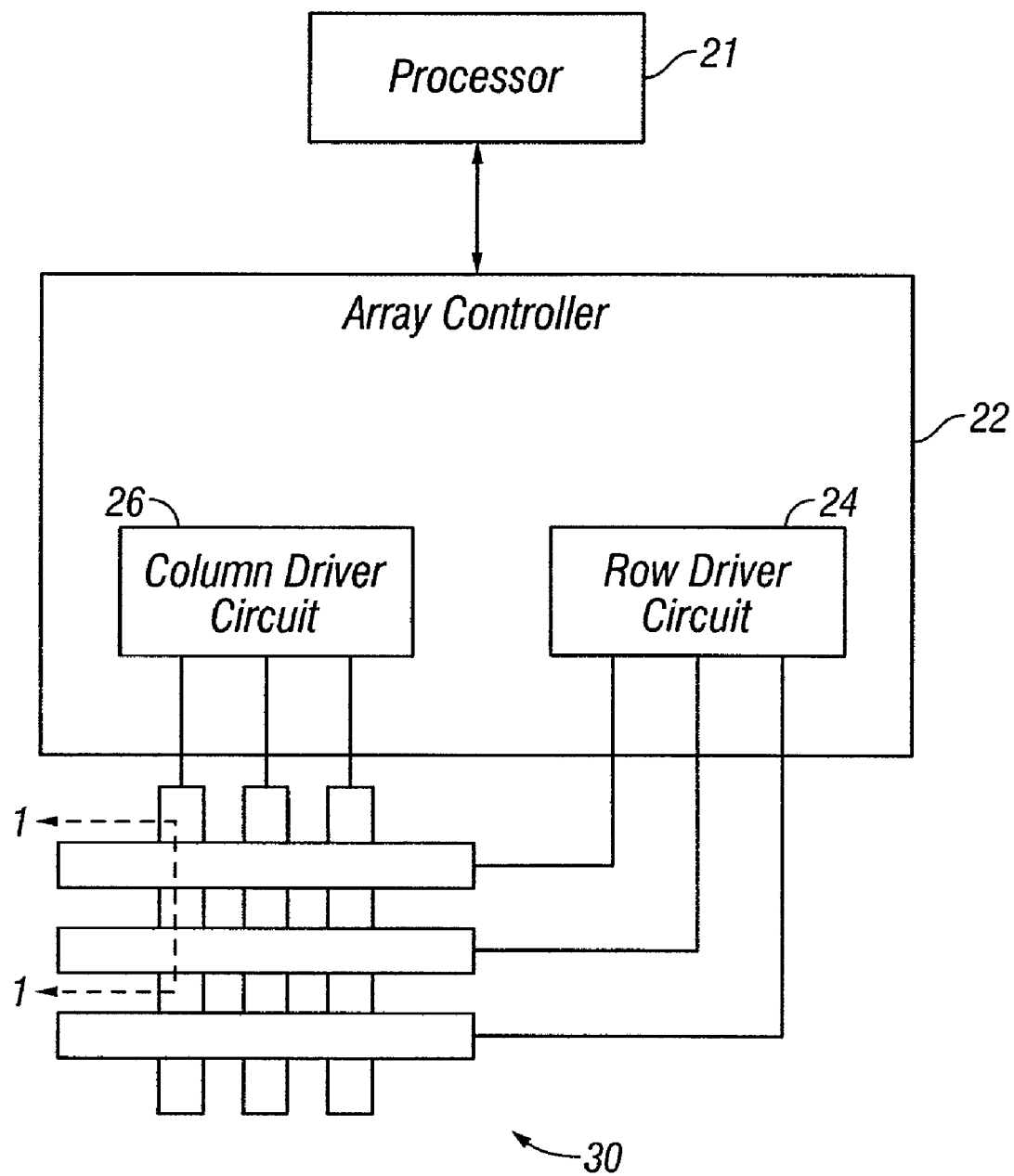
FIG. 2 is a system block diagram illustrating one embodiment of an electronic device incorporating a 3×3 interferometric modulator display.

FIGS. 2 through 5 illustrate one exemplary process and system for using an array of interferometric modulators in a display application. FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array controller 22. In one embodiment, the array controller 22 includes a row driver circuit 24 and a column driver circuit 26 that provide signals to a pixel array 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the released state to the actuated state. However, when the voltage is reduced from that value, the movable layer maintains its state as the voltage drops back below 10 volts. In the exemplary embodiment of FIG. 3, the movable layer does not release completely until the voltage drops below 2 volts. There is thus a range of voltage, about 3 to 7 V in the example illustrated in FIG. 3, where there exists a window of applied voltage within which the device is stable in either the released or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be released are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or released pre-existing state. Since each pixel of the interferometric modulator, whether in the actuated or released state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
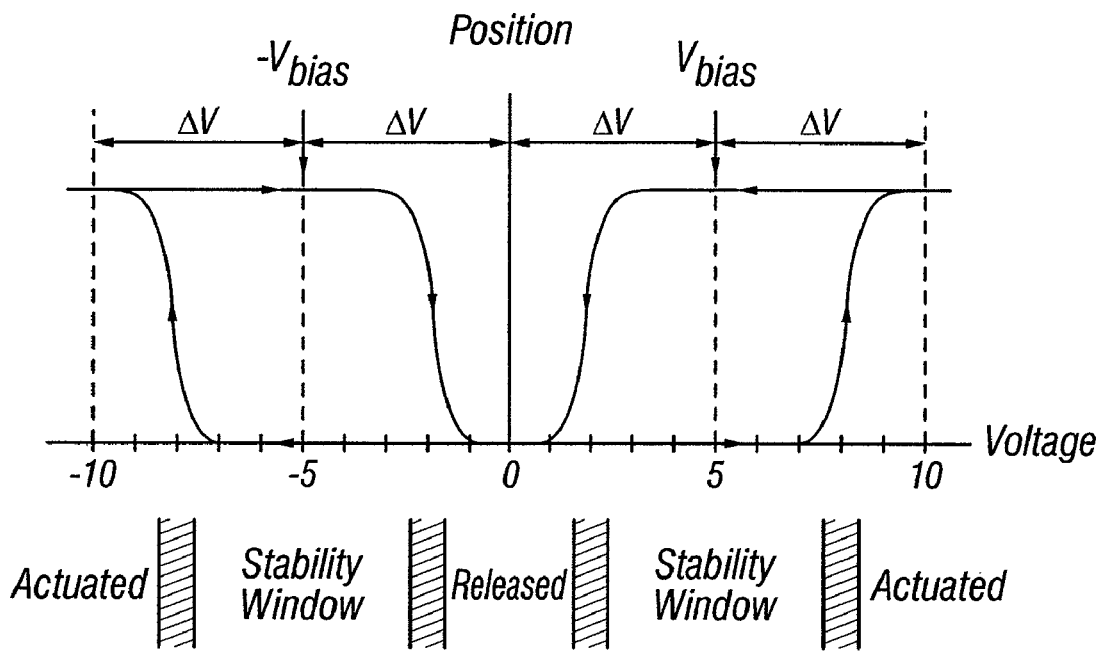
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Releasing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$.

Figure 5A:
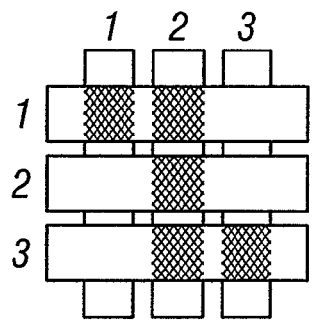
FIGS. 5A and 5B illustrate one exemplary timing diagram for row and column signals that may be used to write a frame of display data to the 3×3 interferometric modulator display of FIG. 3.
Figure 5B:
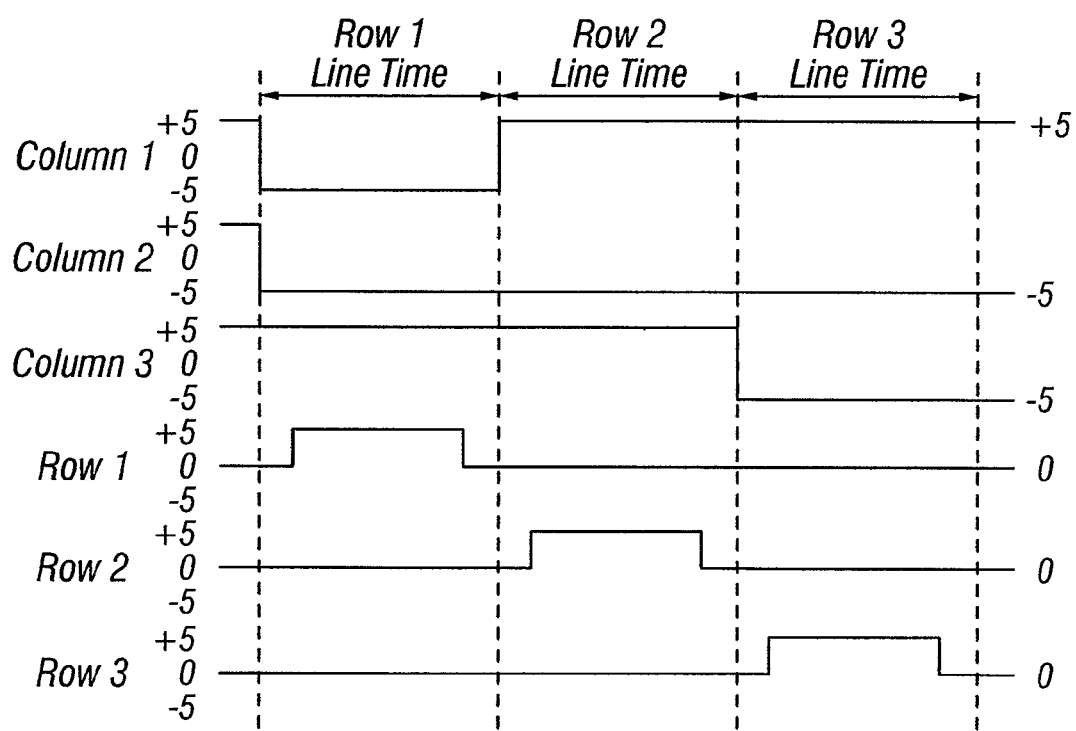

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or released states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and releases the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and release pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the present invention.

Figure 6A:
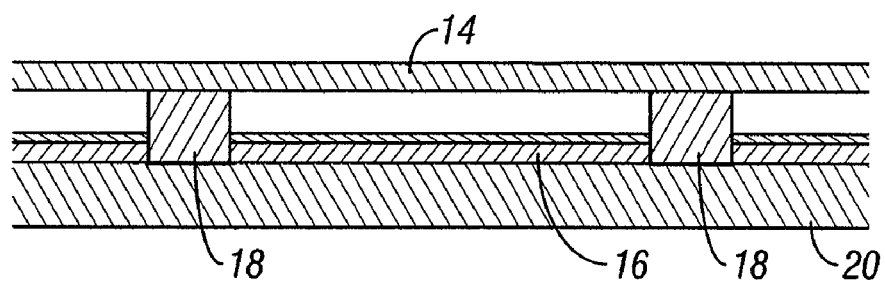
FIG. 6A is a cross section of the device of FIG. 1.
Figure 6B:
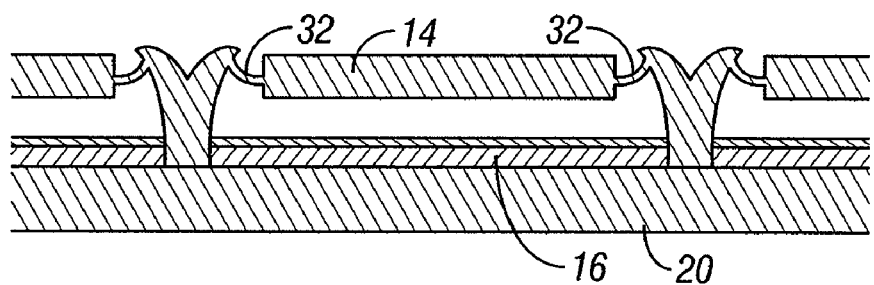
FIG. 6B is a cross section of an alternative embodiment of an interferometric modulator.
Figure 6C:
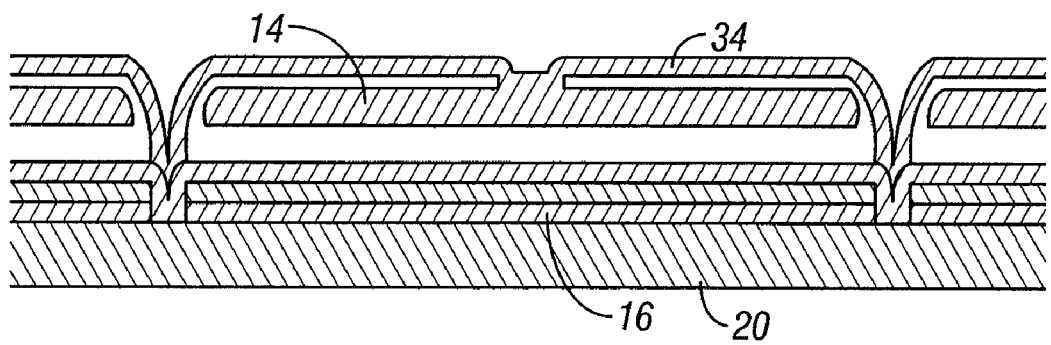
FIG. 6C is a cross section of another alternative embodiment of an interferometric modulator.

The details of the structure of interferometric modulators that operate in accordance with the principles set forth above may vary widely. For example, FIGS. 6A-6C illustrate three different embodiments of the moving mirror structure. FIG. 6A is a cross section of the embodiment of FIG. 1, where a strip of metal material 14 is deposited on orthogonally extending supports 18. In FIG. 6B, the moveable reflective material 14 is attached to supports at the corners only, on tethers 32. In FIG. 6C, the moveable reflective material 14 is suspended from a deformable layer 34. This embodiment has benefits because the structural design and materials used for the reflective material 14 can be optimized with respect to the optical properties, and the structural design and materials used for the deformable layer 34 can be optimized with respect to desired mechanical properties. The production of various types of interferometric devices is described in a variety of published documents, including, for example, U.S. Published Application 2004/0051929. A wide variety of well known techniques may be used to produce the above described structures involving a series of material deposition, patterning, and etching steps.

The lifetime of an interferometric modulator of the type discussed above can be greatly extended by protecting the interferometric modulator from mechanical interference, excessive moisture, and other potentially damaging substances. Embodiments of interferometric modulator-based displays utilize a backplate (also referred to as a backplane) to provide this protection. For example, the edge of a backplate can be attached with adhesive near the edge of the transparent substrate to prevent mechanical interference from reaching and potentially damaging the interferometric modulator elements fabricated on the backside of the display glass. Additionally, the backplate together with its adhesive attachment to the transparent substrate prevents moisture and other potentially detrimental gases, liquids and solids from reaching the interferometric modulator elements. Accordingly, the backplate can be transparent or opaque, conductive or insulating, essentially two-dimensional or projecting appreciably into a third dimension. In one embodiment, the backplate can be made of material completely unsuitable for use as a transparent display substrate, such as an opaque metal.

It can be seen in embodiments of interferometric-based displays, the backplate need not serve any role as an active or functional component of the display. Thus, a minimal set of requirements and specifications related to the functionality of the display are placed on the backplate. Consequently, there is significant freedom available in the backplate design to address other system needs and functions. Configurations in which the backplate is employed for multiple, non-packaging-related purposes are well suited for use in display-centric products which incorporate MEMS-based displays and associated ancillary components.

The backplate itself can be part of the display's lighting system. Any number of RF-related functions including but not limited to shielding, passive components, and antennas can be integrated into the backplate. As described herein, the backplate can be a PC board, an electronics layer, an electrical connection component, a battery, or merely a mechanical component to support or hold other components that serve various purposes in a device. The backplate can be used to implement any suitable function of the electronic product. The capabilities described above are possible since the nature of the interferometric modulator display imposes only a limited set of requirements on the backplate.

The backplate can be employed to hold electronics, and the footprint of the back plate can be expanded well beyond the active display area formed by the interferometric modulator so that the backplate essentially becomes a "backbone" for and the principal structural element of the device which contains the display. In some embodiments this is desirable because the display can be made much stronger than conventional displays that require glass materials for a backplate.

Accordingly, it is desirable to employ the backplate to perform various device functions or to impart desirable attributes to the devices. For example, the backplate can reduce the amount of volume consumed by components and parts in a portable electronic device by providing a means for integrating such components directly onto the backplate. By using backplate materials of increased durability the display will have increased resistance to damage by mechanical shock or other means. Also, the component integration can improve portability, reduce weight, improve handling, and increase ruggedness of the device. Cost savings in the manufacturing process can be achieved by increasing the degree of integration within the device (e.g., by having components or sub-assemblies perform a greater number of functions), thereby reducing the overall number of parts in the device.

The configurations of the embodiments herein can be suitable for use in display-centric products, such as cell phones, laptop computers, digital cameras, and GPS units. Such devices are display-centric in the sense that each relies on a flat panel display as a primary means of providing information. The display can also participate in input functions. Accordingly, the display can have an impact on the mechanical, electrical, system, and aesthetic design aspects of the product that often exceeds the contributions from the other components in the product. The display is often constructed from a material, such as glass, which tends to be more fragile than the rest of the materials comprising the product. As a result, the mechanical and product design process tends to be centered on the capabilities and characteristics of the display, instead of, e.g., the processor or the battery. Many components within handheld products share similar footprints. These include PC boards, light sources, keyboards, batteries, integrated circuits, supplementary or alternative flat panel displays, and others. Because they are generally planar, the design tools from which they derive produce a similar output, usually in the form of one or more photolithographic masks or other phototools. Thus, there are opportunities for increased integration and increased efficiency in the design process which can be significantly enabled by incorporating functions into the backplate.

In one embodiment, the packaging of a MEMS component, such as an interferometric modulator-based display, enables mechanical support for a wide range of components, including but not limited to drivers, processors, memory, interconnect arrays, vapor barriers, the product housing, and the like. The backplate of the interferometric modulator matrix, in its simplest form, serves to provide a barrier to particles and gasses that can interfere with the functioning of the array. By further imbuing the interferometric modulator backplate, or carrier, with a functionality of one or more of the remaining product components, a higher degree of integration and design efficiency can be achieved.

Embodiments of the invention provide a means for reducing the form-factor and number of components required in a MEMS-centric product without affecting the number of functions performed. In one embodiment, where the MEMS is an interferometric modulator display, this is achieved as a result of the nature of the interferometric modulator array, which is monolithically fabricated on a single substrate.

Figure 7:
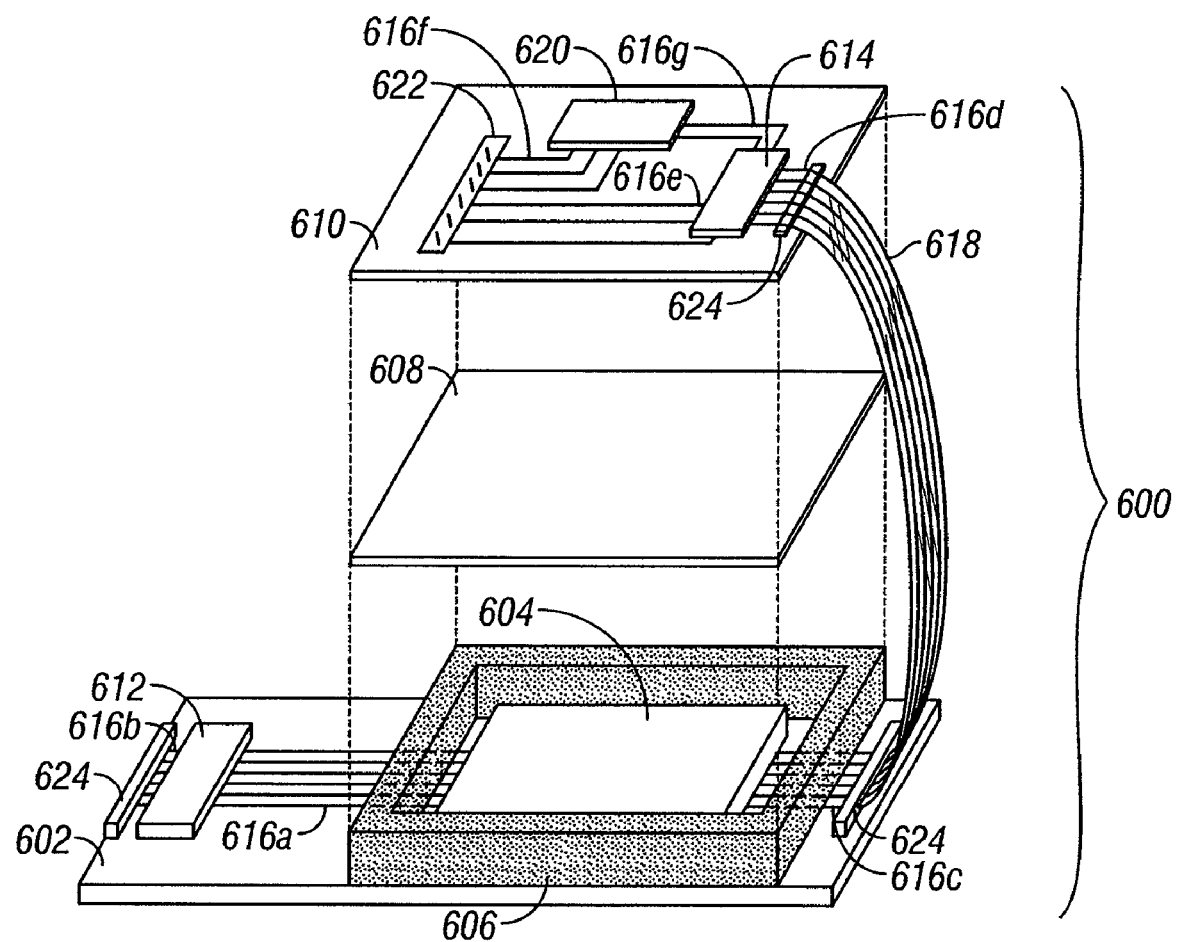
FIG. 7 is an exploded view of an embodiment of a display in which a printed circuit carrier is bonded to a backplate.

FIG. 7 depicts an embodiment of an interferometric modulator display device 600, shown in an exploded view. The device 600 includes a transparent substrate 602, which includes an array 604 of interferometric modulators configured to reflect light that has entered through substrate 602 back through substrate 602 and onward to a viewer. An array of interferometric elements such as array 604 provides a means for modulating light and reflecting it towards a viewer. The transparent substrate 602 may comprise a layer of glass. In an alternate embodiment, the transparent substrate 602 may advantageously comprise a layer of transparent polymeric material, or any other suitable sufficiently transparent material. The transparent substrate 602 thus provides a means for supporting array 604. In certain embodiments, the transparent substrate 602 can be from about 0.7 to 0.5 mm, depending on the nature of the manufacturing process and product. The device 600 also includes driver chip 612, located on the same side of substrate 602 as array 604, and placed in electrical connection with array 604 through trace leads 616a, to which driver chip 612 is directly bonded. This approach to chip placement is known as chip on glass (COG). The driver chip 612 can be placed in electrical connection with external circuitry (not shown) through trace leads 616b which connect with a mounting point 624 (e.g. for a flex cable).

Located on substrate 602, and surrounding the array 604, is a seal 606, depicted here as an annular seal, under which the trace leads 616a and 616c run. The seal 606 may be referred to as a seal ring, as in various embodiments, the seal 606 completely encircles the array 604. The seal 606 may be a semi-hermetic seal, such as a conventional epoxy-based adhesive. In other embodiments, the seal 606 may be a PIB, o-ring(s), polyurethane, liquid spin-on glass, solder, polymers, or plastics, among other types of seals. In still other embodiments, the seal 606 may be a hermetic seal, such as a thin film metal weld or a glass frit. In alternate embodiments, the seal ring may comprise an extension of either one or both of the backplate or transparent substrate. For example, the seal ring may comprise a mechanical extension (not shown) of a backplate 608. In still other embodiments, the seal ring may comprise a separate member, such as an annular member.

Still with respect to FIG. 7, the backplate 608, together with at least the seal 606 and transparent substrate 602, forms a protective cavity enclosing the array 604 of interferometric modulators. Although not shown, a desiccant may be provided within the protective cavity, in order to prevent moisture buildup over the lifetime of the device. The backplate 608 may be made of any suitable material, whether transparent or opaque, conductive or insulating. Suitable materials for the backplate 608 include, but are not limited to, glass (e.g. float, 1737, soda lime), plastic, ceramics, polymers, laminates, and metals and metal foils (e.g. stainless steel (SS302, SS410), Kovar, plated Kovar). In contrast to an LCD, which would require electrode arrays on both substrates, the array 604 resides on only one substrate, enabling backplate 608 to be made of a material which is thinner and/or completely different from the material used in transparent substrate 602. In one embodiment, the backplate 608 is adapted to prevent moisture from entering the protective cavity and damaging the array 604. Thus, a component such as backplate 608 provides a means for protecting the array 604 from moisture and other environmental contaminants.

The use of materials other than glass in construction of the backplate can provide several advantages. Backplates formed from alternate materials which are thinner and lighter than backplates formed of glass, such as stamped metal backplates, permit the creation of thinner, lighter displays. Reducing the weight of the backplate has particular advantages with respect to portable display-centric devices, as those devices are frequently dropped. If the backplate is lighter, less force will be transferred to the frontplate upon impact with the ground. In addition, stamped metal backplates may be less expensive to produce in large quantities than glass backplates.

The display also includes a printed circuit (PC) carrier 610, located on the opposite side of backplate 608 as the transparent substrate 602. The PC carrier 610 may be a PC carrier/component stack-up for a display product such as a personal digital assistant (PDA) or a cellular phone. The PC carrier 610 may be fabricated separately from the backplate 608, and then bonded to the backplate.

An alternate placement is shown for driver chip 614, which is located on the upper side of PC carrier 610, and is in electrical connection with array 604 by means of trace leads 616*c* and 616*d* and flex cable 618. The flex cable 618 is mounted to PC carrier 610 and transparent substrate 602 in order to provide electrical communication between the devices on the PC carrier 610 and the transparent substrate 602. Driver chip 614 can be placed in electrical connection with external circuitry through trace leads 616*e* and external interconnect pins 622. An alternate approach to COG is known as chip on flex (COF), or tape automated bonding (TAB). Although not depicted in FIG. 7, a driver chip could be bonded directly to a flex connector such as flex connector 618, and placed in electrical connection with the array 604 by trace leads running to the point on the substrate on which the flex connector is mounted. PC carrier 610 also provides physical support for additional electronic components 620 (e.g. ICs and passives) which can be connected to external circuitry via external interconnect pins 622 and trace leads 616*f*, or in connection with driver chip 614 via trace leads 616*g*. Certain of these electronic components, such as driver chips 612 and 614, provide a means for controlling the state modulators within the array 604.

PC carrier 610 can be a single or multilayer conductor polymer laminate which can be fabricated using any suitable technique. It can comprise one or more polymeric layers which provide structural support and/or insulation for one or more layers of interconnections comprising patterned or non-patterned conductors. The conductors provide electrical connections between the different components mounted on the surface. Because PC carrier 610 can be a multilayer conductor polymer laminate, the interconnections are not limited to trace leads on a surface of the carrier as depicted in the FIG. 7, but may also include alternate interconnections such as leads located within the carrier 610.

Although the backplate 608 can provide a vapor transmission barrier sufficient to protect array 604 in the embodiment of FIG. 7, in alternative embodiments discussed below with respect to other figures the functions of the backplate 608 are performed by the carrier. In such embodiments, the carrier may advantageously comprise materials which minimize or prevent vapor transmission. The skilled artisan will appreciate that PC carriers formed of FR4 will transmit water vapor at a relatively high rate. In some alternative embodiments, the PC carrier 610 may be formed of or include gold plated thin film metals to enhance the water vapor transmission barrier of the carrier. Other suitable materials for the carrier 610 include, but are not limited to, ceramics, aluminum nitride, beryllium oxide, and alumina. The PC carrier 610 may be formed of a board or a flexible sheet.

The PC carrier 610 serves to support the components which are associated with the display operation. The PC carrier 610 can be connected to additional PC carriers which carry components relevant to the overall operation of the product, or provide physical and electrical support to these components as well. Therefore, a component such as PC carrier 610 provides a means for supporting these electronic components. The PC carrier 610 may include electronic interfaces for use with radio-frequency (RF) signals. The skilled artisan will understand that the PC carrier 610 may serve not only as protection for circuitry that is integrated into the backplane but may also enhance RF circuit needs. For example, metal caps may be included for RF enhancement or protection. Antenna properties may also be incorporated into the PC carrier 610 or the interferometric modulator array 604, including, but not limited to, the use of a metal backplane or a metal cap as an antenna for a cell phone.

Although for simplicity only six trace leads 616*a,c* are shown connecting the driver chips 612 and 614 with array 604, it will be understood that many more trace leads may be necessary for the driver chips to control the state of the array 604, depending on the size of the array. Similarly, although only three trace leads 616*b,e* are depicted as connecting the driver chips with external circuitry, certain embodiments may require different numbers of input trace leads. Similarly, although for simplicity no trace leads are depicted in this figure as running to the top or bottom (with respect to the figure) of array 604, it will be understood that embodiments of the present invention can utilize the configurations discussed with respect to this and following figures to provide an electrical connection with any portion of the array 604 (e.g. to provide both row and column signals from driver circuitry).

The trace leads 616a,c (alternately and interchangeably referred to as conductive busses or electrical traces) may comprise electrical traces formed from conductive material. These traces 616a,c may be between about 25 micrometers (μm) and 1 millimeter (mm) wide, e.g., about 50 micrometers across, and may be between about 0.1 micrometers (μm) to 1 micrometers (μm) thick. Larger or smaller sizes, however, are possible. The trace leads 616a,c may comprise metal in some embodiments. Photolithographic, electroplating, as well as electroless techniques may be employed to form the trace leads. In certain embodiments, a metal based slurry or silver paste may be employed. Other methods and materials may also be used to form the trace leads.

Figure 8A:
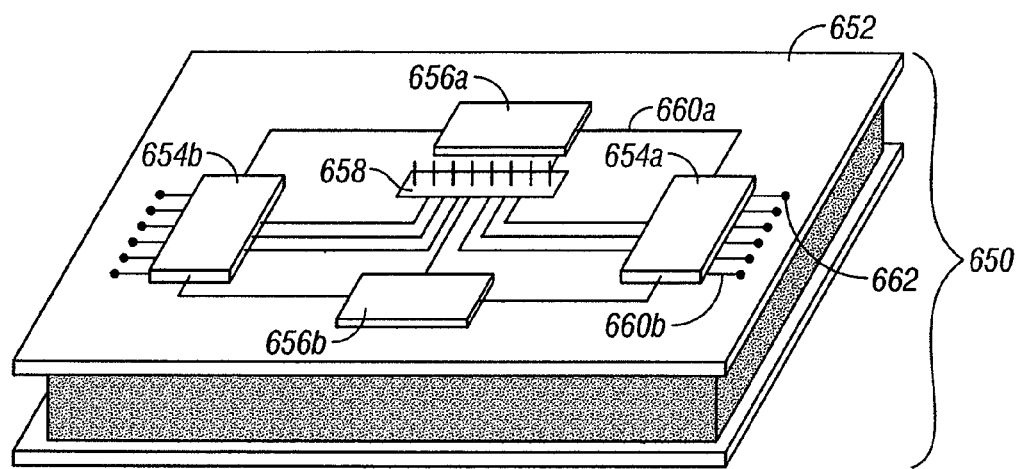
FIG. 8A is an assembled view of an embodiment of a display in which an interferometric modulator carrier serves as the backplate and is connected to an array of interferometric modulators on a substrate.
Figure 8B:
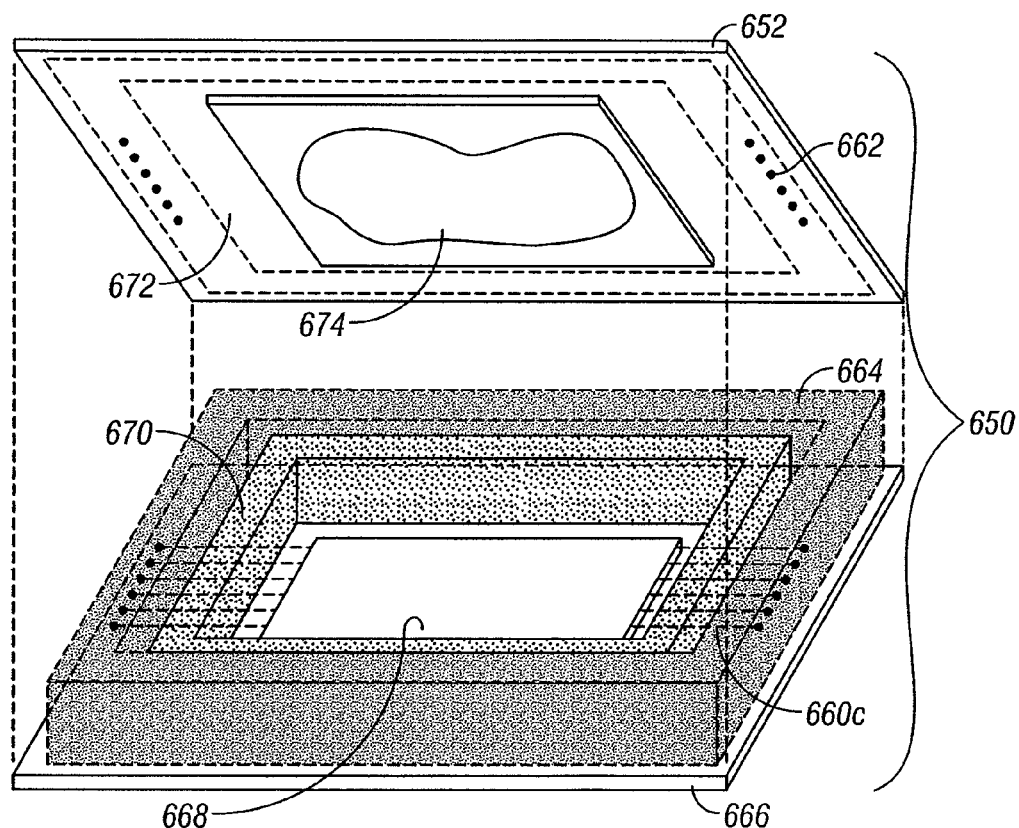
FIG. 8B is an assembled view of the embodiment of FIG. 8A.

In an alternate embodiment, the backplate 608 (FIG. 7) is eliminated and the PC carrier itself makes up the backplate. FIGS. 8A and 8B depict such a display device 650. As can be seen in FIG. 8A, which depicts device 650 in an assembled state, carrier 652 provides physical support for driver chips 652a and 652b, which are in electrical connection with electronic components 656a and 656b and external interconnect pins 658 via trace leads 660a, which may be located on or within carrier 652. Driver chips 654a,b are also in electrical connection with electrical feedthroughs 662 via trace leads 660b.

As can be seen in FIG. 8B, which depicts device 650 in an exploded view, electrical feedthroughs 662 extend from the upper surface of carrier 652 to the lower surface. When assembled, anisotropic conducting film ledge 664 provides an electrical connection between feedthroughs 662 and trace leads 660c located on the upper surface of transparent substrate 666. Trace leads 660c are in electrical contact with array 668 of interferometric modulators located on the upper surface of transparent substrate 666, enabling an electrical connection between driver chips 654a,b and array 668. When device 650 is assembled, seal ring 670 forms, along with transparent substrate 666 and carrier 652, a protective cavity around array 668. Thus, a carrier such as carrier 652 provides a means for supporting electronic circuitry, such as driver circuitry, and for protecting the array 668.

ACF materials are conveniently employed for providing electrical interconnects between components, and they are often used to connect the flex connector of TAB drivers to display substrates. However, other connection methods can be employed, including but not limited to zebra connectors, flex cables, bump bonds, and micromechanical pressure conductors (e.g. MEMS springs), which are described in greater detail with respect to FIG. 10B.

In certain embodiments in which the interferometric modulator carrier 652 is formed from materials through which vapor can permeate into the protective cavity, the interior side of interferometric modulator carrier 652 may be advantageously coated with a vapor barrier 672. In addition to, or in place of, vapor barrier 672, desiccant 674 may be provided within the protective cavity. In FIG. 8B, a layer of desiccant 674 is shown below the vapor barrier 672. In embodiments in which the interferometric modulator carrier 652 is made of a substrate that is sufficiently vapor resistant, no vapor barrier 672 is required.

Figure 9A:
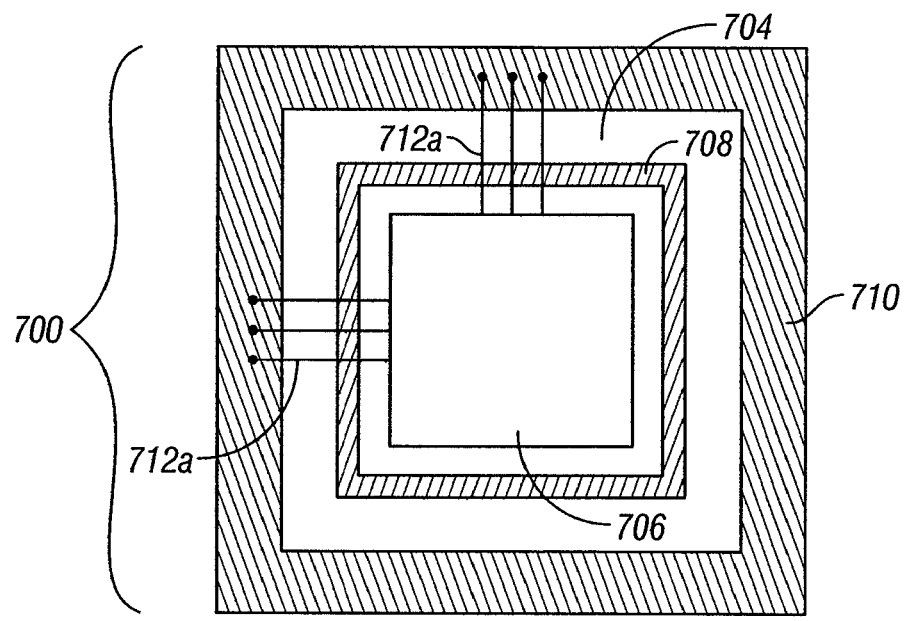
FIG. 9A is a top view of the lower component of an embodiment of a display in which an interferometric modulator carrier serves as the backplate and is connected to an array of interferometric modulators on a substrate.
Figure 9B:
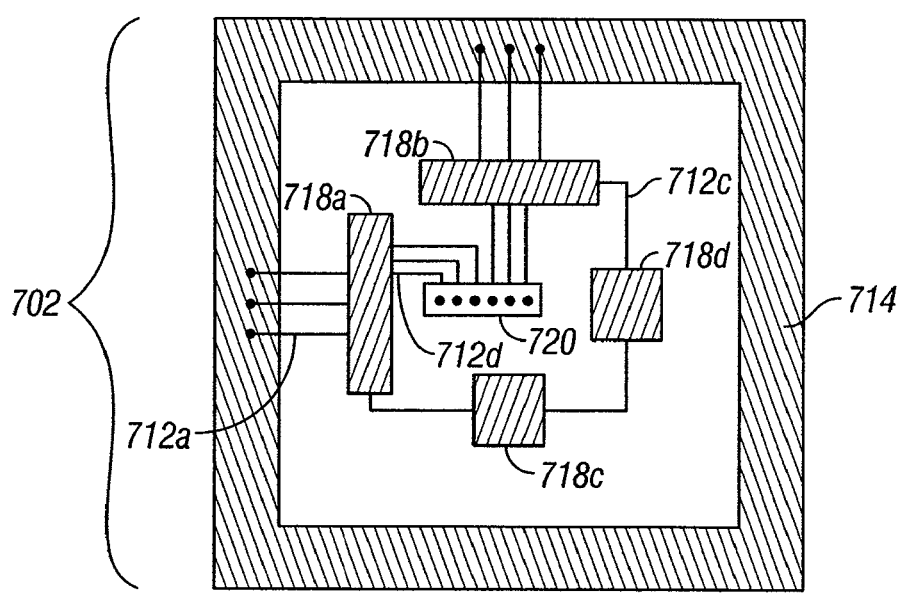
FIG. 9B is a top view of the upper component of an embodiment of a display in which an interferometric modulator carrier serves as the backplate and is connected to an array of interferometric modulators on a substrate.

FIGS. 9A and 9B depict a top view of two components, 700 and 702 that come together to make a display device similar to the device 650 shown in FIG. 8. FIG. 9A depicts the lower portion 700 of the two components which come together to make the display device. A transparent lower substrate 704 includes an interferometric modulator array 706 which is configured to reflect light through the substrate 704. Surrounding the outer edges of the substrate 704 and circumscribing a seal ring 708 is an ACF ledge 710 which provides electrical connections to the array 706 via trace leads 712a located on substrate 704.

FIG. 9B depicts a top view of the upper portion 702 which is configured to mate with the lower portion 700 and come together to make the display device. A corresponding interconnect ledge 714, located along the edge of this interferometric modulator carrier 716, circumscribes a set of electronic components 718a-d (e.g. driver chips, ICs, passives, etc.), at least some of which (718a,b in this embodiment) are electrically connected to interconnect ledge 714 via trace leads 712b. Some of electronic components 718a-d are connected to each other via trace leads 712c, and connections between some electronic components 718 and external circuitry can be made via trace leads 712 and external interconnect pins 720. When the two modules are brought together, the connection between interconnect ledge 714 and ACF ledge 710 places electronic components 718a,b in electrical connection with the array 706 located on substrate 704.

Figure 10A:
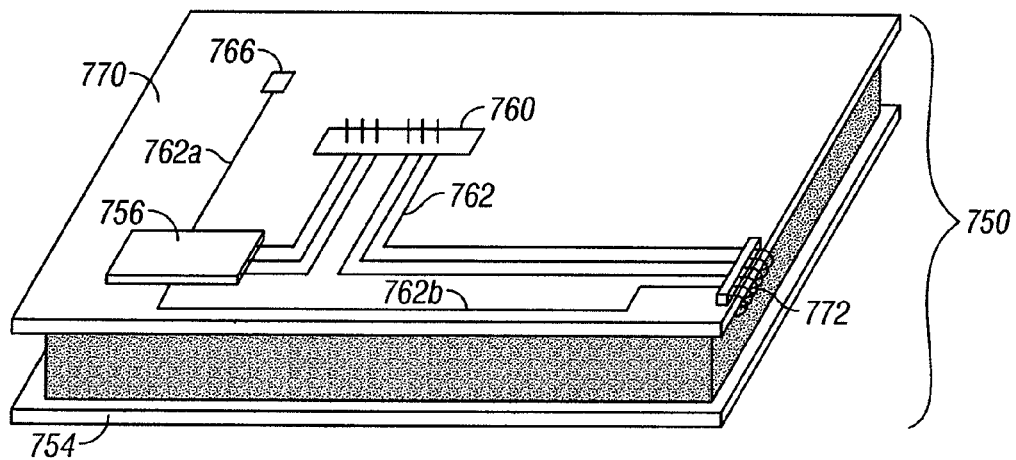
FIG. 10A is an assembled view of an embodiment of a display in which an interferometric modulator carrier serves as the backplate and is internally connected to an array of interferometric modulators on a substrate.
Figure 10B:
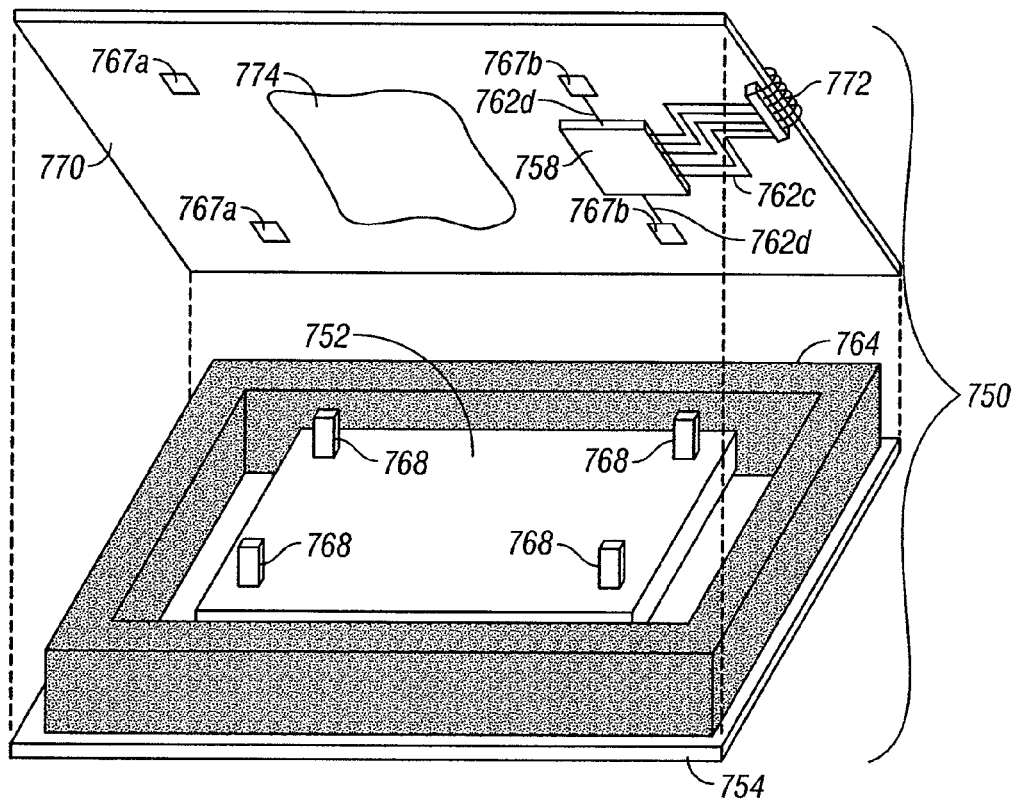
FIG. 10B is an exploded view of the embodiment of FIG. 10A.

FIGS. 10A and 10B depict a reduced footprint display device 750. As will be apparent from the following discussion, the reduced footprint of device 750 is due to the elimination of ledges, such as those seen in FIGS. 7 and 8, on which components such as driver chips and connections were located, exterior to the protective cavity formed by the seal rings. FIG. 10A shows the device 750 in an assembled state, and FIG. 10B shows the device 750 in an exploded view. Referring to FIG. 10A the device 750 includes a transparent substrate 754 which is sealed to an interferometric modulator carrier 770 through a seal ring 764. In this embodiment, the carrier 770 acts as a backplate for the device 750.

The carrier 770 includes a first display circuit 756 which connects through a trace lead 762a to an electrical feedthrough 766. The electrical feedthrough 766 is used as a connection to the interior components of the device 750 as will be explained in more detail with reference to FIG. 10B. The display circuit 756 is also in electrical connection with a set of external interconnect pins 760 for connecting the display device 750 to external devices. In addition, a set of interconnect leads 762b connect the display circuit 756 to a flex cable 772 which provide an electrical connection to the interior components of the device 750.

Referring now to FIG. 10B, the interior components of the reduced footprint display device 750 can be seen. As shown, the transparent substrate 754 includes an interferometric modulator array 752 that is configured to reflect light through the substrate 754. Interior to the interferometric modulator array 752 are a set of conducting posts 768 which are adapted to provide an electrical connection to a matching set of conducting pads 767a on the lower surface of the carrier 770. As will be imagined, the conducting pads 767a are in communication with the electrical feedthroughs 766 so as to provide an electrical link to the display circuit 756 (FIG. 10A).

Of course it should be realized that the display circuit 756 can be connected to the conducting pads 767 through the flex cable 772. As shown, the flex cable 772 mounts to the lower surface of the carrier 770 and is in electrical connection with the conducting pads 767b, which then connect to the interferometric modulator 752 through the conducting posts 768. This configuration does not require feedthroughs to be present in the carrier 770 and thus can reduce the chance that water vapor may traverse the carrier 770 and come in contact with the interferometric modulator 752.

Also shown is a desiccant 774 on the lower surface of the carrier 770 which acts to absorb any moisture that may enter the protective cavity of the device.

Because contacts between the conducting posts 768 and the conducting pads 767*a,b* are internal to the device 750, the material characteristics of the bonds can present issues. ACF materials, which outgas during curing, can produce substances that interfere with the operation of the array. Alternatives to ACF materials include low temperature solders, micromechanical pressure connectors, bump bonds, and other affixing materials which are neutral from a chemical and outgassing standpoint. In some embodiments, such as those employing vacuum packaging, the electrical feedthroughs can act as both interconnects and mechanical standoffs, or just mechanical standoffs. As mechanical standoffs, they maintain a distance between the interferometric modulator array and the interferometric modulator backplate to protect against the force of external mechanical or atmospheric pressures.

Of course, while only a relatively few conducting posts are illustrated in this embodiment, it should be realized that tens, hundreds, or thousands of such posts can be fabricated within the array 752. Similarly, tens, hundreds or thousands of matching conducting pads can be formed on the lower surface of the carrier 770. This allows complex electronic circuits, such as driver circuits to be connected to the array 752.

While FIG. 10 depicts an embodiment using conducting support posts, a variety of structures can be utilized to place the array 752 in electrical connection with the interferometric modulator carrier 770. For instance, micromechanical pressure connectors can be used. Micromechanical pressure connectors come in a variety of forms, and include conductive metallic structures that extend above the plane of the substrate because of inherent mechanical stresses. They can be fingers or coils which when deposited and patterned reside partially on a sacrificial layer and partially on the substrate or on one or more films or structures without an intervening sacrificial layer between it and the structure. In this embodiment, during the final MEMS fabrication step (the release step where the sacrificial layer is removed), the stresses in the connector cause it to displace vertically away from the substrate. If aligned properly with conducting features on an opposing substrate or interferometric modulator carrier, they can provide an electrical interconnect which does not outgas.

It should also be understood that some or all of the driver chips could be placed on the lower surface of the carrier 770 and thereby inside of the sealed cavity formed by the carrier 770, the transparent substrate 754 and the seal ring 764. In this alternate embodiment, as illustrated in FIG. 10B, a circuit chip 758 is mounted on the lower surface of the carrier 770. The chip 758 is in electrical communication with the flex cable 772 via traces 762*c* and the conducting pads 767*b* via traces 762*d*. This allows the chip 758 to communicate with the interferometric modulator array 752 and to the display circuit 756 which is on the upper surface of the carrier 770.

Figure 11:
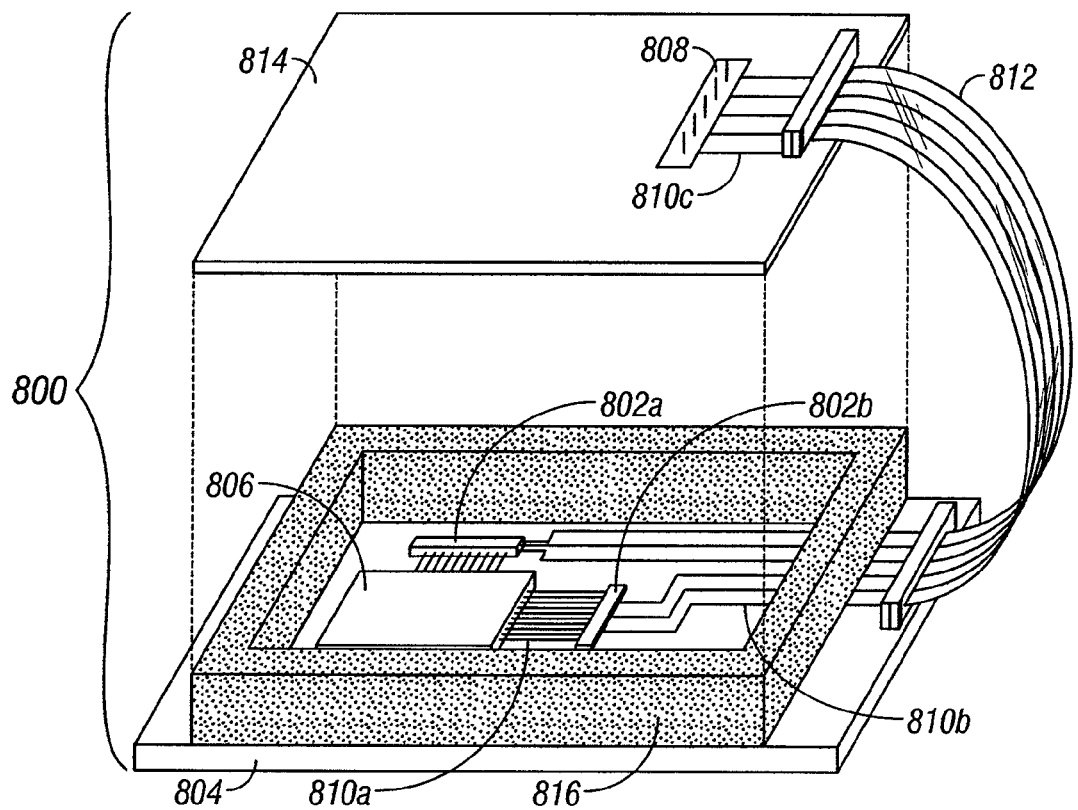
FIG. 11 is an exploded view of an embodiment of a display in which an interferometric modulator carrier serves as a backplate, and electronic components are located on the same surface of the substrate as the array of interferometric modulators.

FIG. 11 depicts an embodiment of a display module 800 in which driver chips 802*a* and 802*b* are located on a transparent substrate 804, and are electrically connected via trace leads 810*a* to an interferometric modulator array 806, so that the driver chips 802*a,b* can control the state of the array 806. The driver chips 802*a,b* are located within a protective cavity formed when the substrate 804 is bonded to interferometric modulator carrier 814 by seal ring 816. The driver chips 802*a,b* are electrically connected to external interconnect pins 808 via trace leads 810*b* and 810*c*, as well as flex cable 812. A configuration in which the driver chips 802*a,b* are located on the same surface as the array 806 may advantageously reduce the number of connections to be made with the interferometric modulator carrier 814, as a driver chip suitable for use in this display may have significantly more outputs than inputs.

Although not depicted, a vapor barrier and/or desiccant can be used on the interior of the protective cavity formed by at least seal ring 816, carrier 814, and substrate 804. Additional components (not shown), including but not limited to those components previously discussed with respect to other embodiments, can be incorporated into display module 800, either on the transparent substrate 804 or on interferometric modulator carrier 814. These components can be internal or external to the protective cavity formed by substrate 804, carrier 814, and seal ring 816, and connections with and between these components can be made using any of the methods discussed above with respect to previous embodiments.

Dual Sided Displays

A class of electronic products employs two displays integrated opposite each other so that there are two viewable surfaces on opposing sides. This class includes "clamshell" phones, which can have a main display which acts as the primary information interface and is revealed only when the product is opened, and a sub-display, which resides on the exterior of the product and provides status information at all times. These phones make aggressive demands on product integration and display module thinness.

Figure 12:
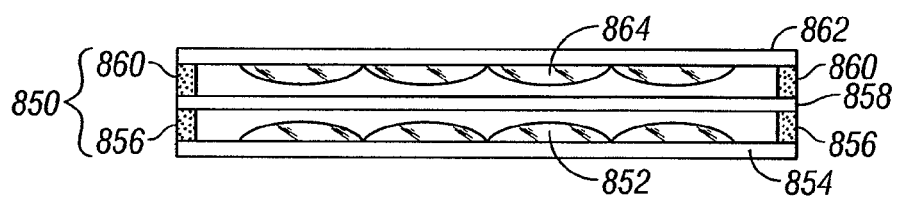
FIG. 12 is a cross-sectional view of one embodiment of a dual-screen display in which an interferometric modulator carrier is disposed between two substrates.

FIG. 12 illustrates dual-sided interferometric modulator based sub-display/main-display module 850. As shown, interferometric modulator array 852 resides on transparent substrate 854 and is bonded via seal ring 856 to interferometric modulator carrier 858. The carrier, 858, is subsequently bonded via seal ring 860 to transparent substrate 862, upon which interferometric modulator array 864 resides. In this particular configuration, the thickness of the overall module 850 is reduced because the two displays share the same carrier 858, which can perform one or more of the functions previously described. Therefore, in certain embodiments, the carrier 858 provides a means for supporting electronic circuitry configured to control the state of array 864.

Although the carrier 858 and each of the substrates 854 or 862 are depicted in FIG. 12 as being the same size, the carrier and/or either of the substrates can extend beyond either of seal rings 856 and 860, and additional components may be located on either of these surfaces external to the seal rings. Thus, the surface area of any one of the carrier 858 or substrates 854 or 862 may be greater than the surface areas of the others. Connections between the interferometric modulators 852 and 864 and the carrier 858, as well as connections through the carrier, can be made via any method or combination of methods discussed previously, including but not limited to flex cables, electrical feedthroughs, trace leads, conductive support posts, or micromechanical pressure connectors.

Figure 13:
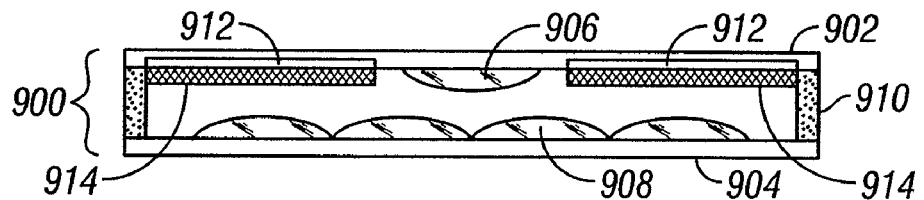
FIG. 13 is a cross-sectional view of a dual-screen display in which a substrate can perform some of the same functions as an interferometric modulator carrier.

Another embodiment of a dual sided display 900 is shown in FIG. 13. In this embodiment the interferometric modulator carrier has been eliminated. An upper transparent substrate 902, bearing an upper interferometric modulator array 906 is bonded via a seal ring 910 to a lower transparent substrate 908 on its opposing side. Lower transparent substrate 904 bears a lower interferometric modulator array 908 and is configured to reflect light through the lower transparent substrate 904. Because the upper interferometric modulator array 906 (which acts as the sub-display) is smaller in size than the lower interferometric array 908, additional area remains on the inner surface of upper transparent substrate 902 which may be used to support various functions that the interferometric modulator carrier would typically support in other embodiments. Thus, in certain embodiments, upper substrate 902 provides a means for supporting electronic circuitry configured to control the state of array 906. In this embodiment, upper transparent substrate 902 can be formed of a polymeric substance which is less vapor resistant than glass. In order to prevent moisture buildup over the lifetime of the device, vapor barrier 912 and desiccant 914 are provided on the inner surface of substrate 902.

In other embodiments of the display 900 depicted in FIG. 13, wherein electronic components such as ICs are located within the protective cavity formed by the upper and lower transparent substrates, the vapor barrier 912 and/or desiccant 914 may be applied directly or indirectly over the electronic components. This application may be done by spray-coating or screen printing, for example, or by any other suitable method.

Figure 14:
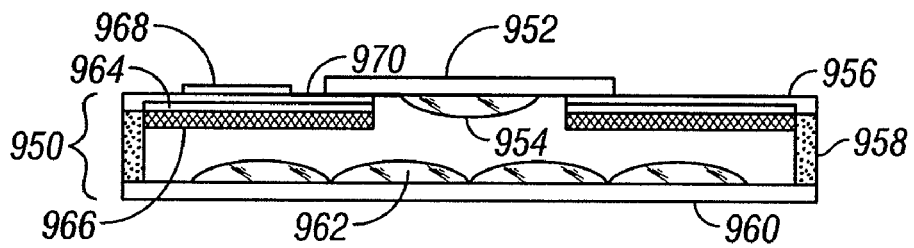
FIG. 14 is a cross-sectional view of a dual-screen display having an annular interferometric modulator carrier.

FIG. 14 illustrates another embodiment of a dual sided display 950, wherein an upper transparent substrate 952 and interferometric modulator array 954 act as the sub-display. In this embodiment, they are bonded and attached to an annular interferometric modulator carrier 956. This assembly is then bonded via a seal ring 958, to a transparent substrate 960 that is configured to pass light to an interferometric modulator array 962. As can be seen, the surface area of the substrate 952 is less than the surface area of the substrate 960. When necessary (e.g. when the annular carrier 956 comprises plastic, which is less vapor resistant than glass), a vapor barrier 964 and desiccant 966 may be provided.

While the module configuration shown in FIG. 14 may not be as thin as that illustrated in FIG. 13, it provides a greater degree of flexibility in the features that can be incorporated in the sub-display carrier plane of the module. Because carrier 956 need not be transparent, the material used can be selected based on other considerations, such as strength. Electrical feedthroughs can be more easily provided through carrier 956 by passing them along the juncture between the transparent substrate 952 and the PC carrier 956. This enables placement of driver chips or other components on the upper surface of the carrier 956. Because of the height of the transparent substrate 952, components such as driver chip 968 which have heights equal to or less than the height of the substrate 952 will not add to the overall height of the device 950. Trace leads 970 can run, for example, from the driver chip 968 located on the upper surface of the substrate 956 directly to the array 954, without the need for flex cables, feedthroughs, or other complex connections. Because carrier 956 can be a multilayer conductor polymer laminate, as discussed previously, leads 970 can run within the carrier 956, advantageously protecting the lead from damage. Leads 970 may advantageously comprise two leads, one on or within carrier 956 and placed in electrical contact with another lead on the lower surface of upper substrate 952.

Figure 15:
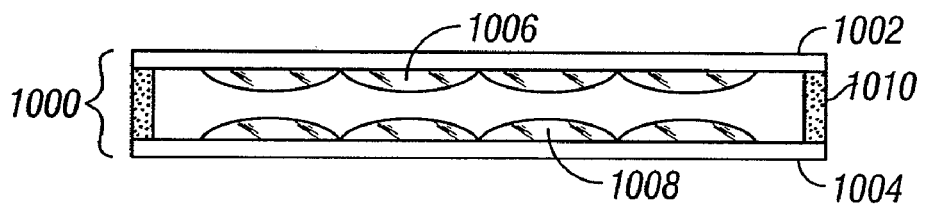
FIG. 15 is a cross-sectional view of a dual-screen display without an interferometric modulator carrier.

Still another embodiment of a dual sided display 1000 is shown in FIG. 15. Components depicted in FIG. 15 include an upper transparent substrate 1002 bearing an interferometric modulator array 1006 configured to reflect light through the transparent substrate 1002. The upper transparent substrate 1002 is bonded via a sealing bead 1010 to a lower transparent substrate 1004, on which interferometric modulator arrays 1008 is located.

Figure 16:
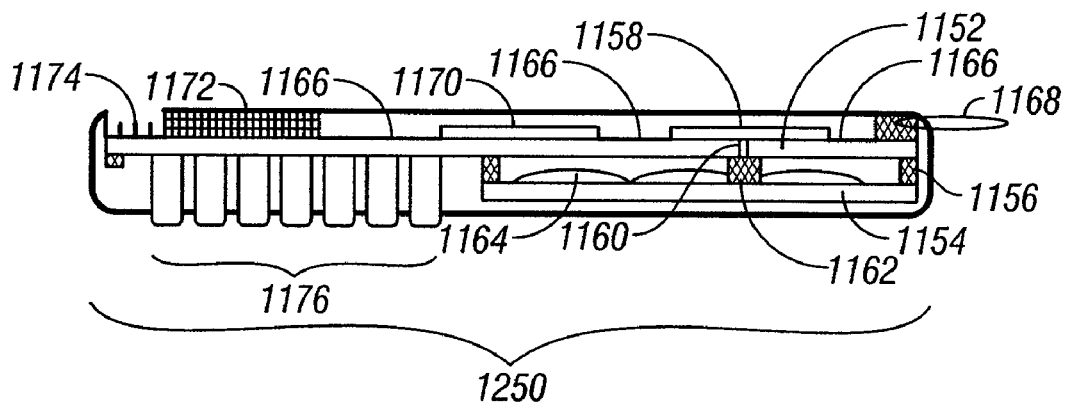
FIG. 16 is a cross-sectional view of a device in which the interferometric modulator carrier of a display can serve as the primary structural support for the device.

FIG. 16 illustrates an embodiment of a device 1150 (e.g. a cellular phone) comprising an interferometric modulator carrier 1152, which is bonded to a transparent substrate 1154 by means of a seal ring 1156. As can be seen from FIG. 16, the surface area of carrier 1152 is larger than the surface area of substrate 1154. Driver chip 1158 is located on the upper side of carrier 1152, and electrically connected via electrical feedthrough 1160 and conducting post 1162 to an array 1164 of interferometric modulators located on substrate 1154 and configured to reflect light through substrate 1154. Located on the same side of the carrier 1152 as the driver chip 1158 and in electrical connection with driver chip 1158 via trace leads 1166 are antenna 1168, device processor/memory 1170, battery 1172 and external interconnect hardware 1174. Located on the opposite side of the carrier 1152 as the driver chip 1158 are the keyboard, keyboard lighting, and microphone hardware, referenced collectively as 1176. Although not shown, the keyboard and microphone hardware 1176 may be placed in electrical connection with the driver chip 1158 on the opposite side of the carrier 1152 by any suitable method, including but not limited to electrical feedthroughs, trace leads, and flex cables of the types discussed above.

As illustrated in FIG. 16, carrier 1152 for the interferometric modulator 1164 is the primary internal structural component while also acting as the electrical interconnect means. This entire assembly is encased in a shell 1166 which need not have the structural rigidity of shells used in products which isolate the display. The construction of this shell and its connection to the interferometric modulator carrier minimize the amplitude of mechanical shocks transmitted to the transparent substrate 1154 and associate components, thereby increasing the product's overall ruggedness. Carrier 1152 thus becomes the "backbone" of the device.

In contrast with conventional display-centric device assembly methods, in which the strength of the device comes from the case encapsulating the device, the strength of the device can come instead from the carrier 1152 located within the device, as the carrier serves as the primary structural component of the device. The increased strength of the carrier 1152 may be a result of the materials which comprise the carrier. Alternately or in addition to the choice of materials, the strength of the carrier may be the result of the dimensions of the carrier. For instance, increasing the thickness of the carrier 1152 or modifying the cross-sectional shape of the carrier can provide the strength necessary for the carrier to function as a primary structural component of the device 1150. Many other configurations are possible with this technique that increases both the physical and structural role the interferometric modulator carrier plays in the product.

Contoured Backplates

Figure 17A:
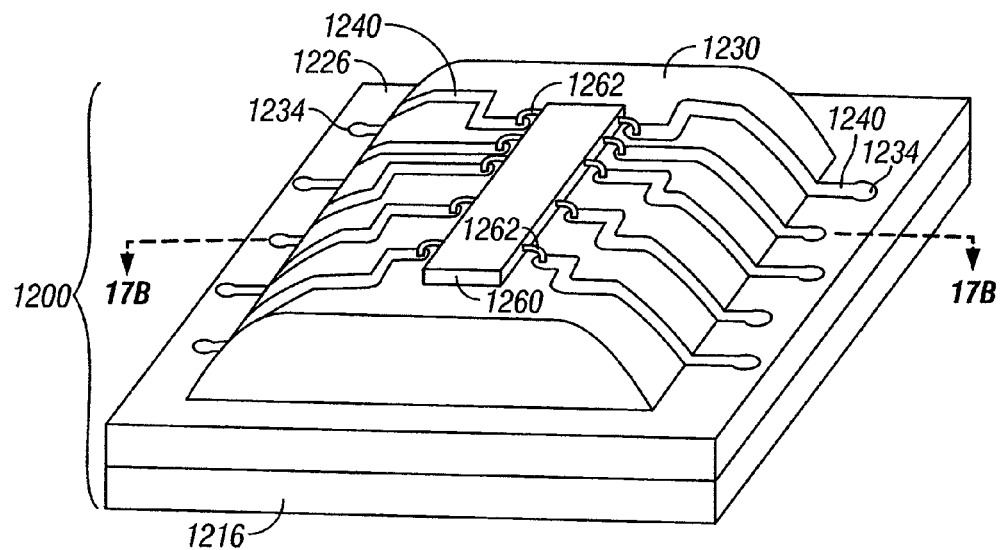
FIG. 17A is a perspective view of an embodiment of a display in which a contoured interferometric modulator carrier serves as a backplate.
Figure 17B:
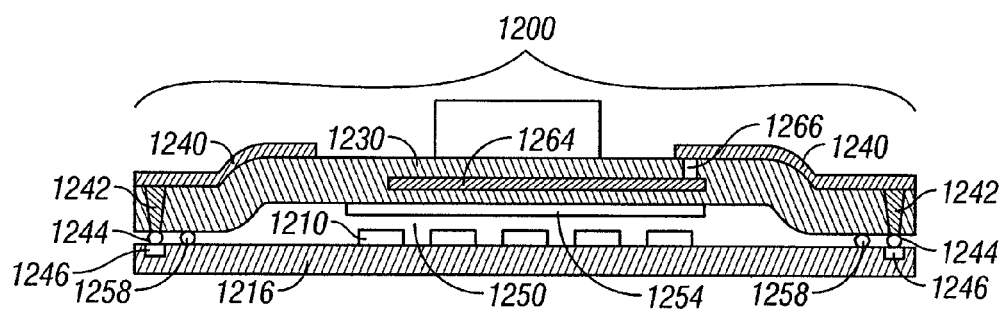
FIG. 17B is a cross-sectional view of the embodiment of FIG. 17A.

In yet another exemplary embodiment, the backplate comprises a shaped printed circuit board or other shaped interferometric modulator carrier. FIGS. 17A and 17B depict an embodiment of a device 1200 comprising a shaped backplate 1228. As can be seen in FIG. 17A, the backplate 1228 has a central region 1230 that is domed. This domed central region 1230 is surrounded by a perimeter region 1226 that is substantially flatter.

In the embodiment of FIGS. 17A and 17B, the backplate 1228 comprises a printed circuit board (PCB). This printed circuit board is curved such that a cavity 1250 (see FIG. 17B) within the device 1200 is sufficiently large to accommodate an array 1210 of modulators housed therein. In embodiments using a PCB for the backplate 1228, the shaped cavity 1250 may be formed by stamping the PCB backplate 1228 or any other suitable method for shaping or cutting a PCB. In alternate embodiments, the backplate 1228 may comprise glass or a glass compound, which is substantially impermeable to moisture. If made of glass, the shaped central region 1230 of the backplate may be formed by sandblasting or any other suitable glass shaping or cutting method.

In the embodiment shown in FIG. 17A, an electrical component 1260 is mounted to the backplate 1228. A set of trace leads 1240 extend from holes 1234 in a perimeter region 1226 of the backplate 1228 and are electrically connected to the electrical component 1260. Leads 1262 from the electrical component 1260 may, for example, be soldered to the trace leads 1240. As will be discussed further with respect to FIG. 17B, the holes 1234 comprise vias 1242 which enable an electrical connection to be made between the upper and lower surfaces of backplate 1228. In one exemplary embodiment, the electrical component 1260 is a driver chip that is configured to control the state of modulators in the array 1210. In other embodiments, the electrical component could be any variety of electrical components or devices, including but not limited to other integrated circuits, other passive and active electrical structures or components, or other surface-mounted electronics such as transistors, capacitors, resistors, diodes, inductors, etc.

Now with respect to FIG. 17B, it can be seen that attaching the backplate 1228 to a substrate 1216 forms a cavity 1250 in the package structure 1200. The array 1210 of modulators is housed in this cavity 1250 between the backplate 1228 and the substrate 1216. As described above, the backplate 1228 is domed. The curvature of the domed central region 1230 also produces a recess 1252 where the distance between the backplate 1228 and the substrate 1216 is greater than in other parts of the cavity 1250. The cavity 1250 is thus advantageously enlarged in the central region 1230 where the array 1210 of modulators is disposed.

Room for unimpeded operation of the modulators the array 1210 is thereby provided. Although the central region 1230 of the backplate 1228 is depicted as domed, numerous other shapes are also within the scope of the invention. For example, the backplate 1228 may have a curved or recessed shape that is not necessarily limited to the central region 1230 or may have other shapes such as a ribbed design or a raised rectangular design. In one embodiment, the edges of the backplate 1228 are beveled so that they provide a lower profile. As long as at least a portion of the modulators in the array 1210 are within an enlarged region or cavity of the backplate 1228, then the desired room for unimpeded operation of the that portion of the array 1210 is provided.

A plurality of through holes 1234 are formed in the perimeter region 1226. The holes 1234 are staggered in the embodiment shown in FIG. 17B. Separation between alternating holes 1234 may be between about 50 to 75 micrometers in some designs. In other embodiments, wherein the holes 1234 are not staggered, the pitch may also be between about 75 to 125 micrometers (μm). The backplate 1228 may have a thickness of between about 0.5 and 2.0 millimeters (mm) and thus the through holes will also be the same depth so as to penetrate completely through the backplate 1228. Values outside these ranges, however, are also within the scope of the invention.

The number and configuration of holes 1234 can vary in different embodiments of the invention. For example, in one embodiment the holes 1234 may be in the domed or recessed central region 1230 of the backplate 1228. Placement of the holes 1234 will depend on the specific functionality desired. The exact position, and combinations of positions, of the holes 1234, are within the skill in the art. The holes 1234 may be formed by mechanically drilling, laser drilling, or ultrasonic drilling, for example. Other standard methods of forming the holes 1234 may also be employed.

FIG. 17B also shows the electrical traces 1240 disposed on, and traversing, the printed circuit board backplate 1228. An electrical connection is formed between the backplate 1228 and the spatial modulator, as described above (see FIG. 17A). For example, in the embodiment shown, the electrical traces 1240 contact vias 1242 that pass through the printed circuit board backplate 1228. The vias 1242 may be, for example, plated vias fabricated in any manner well known in the printed circuit board field. Solder 1244 between the vias 1242 and a set of electrical pads 1246 on the substrate 1216 provides a conductive pathway therebetween. As a result of these electrical connections, the electrical traces 1240 on the PCB backplate 1228 are in electrical communication with the electrodes in the array 1210 of modulators. As described above, a wide variation in the designs of and processes for fabricating the electrical connection between the PCB backplate 1228 the modulator array 1210 are possible.

As illustrated in 17B, the PCB backplate 1228 may comprise a multilayer structure. For example, a metallization layer 1264 can be embedded in the printed circuit board backplate 1228. This metallization layer 1264 is electrically connected to one of the traces 1240 by a conducting plug 1266 as is conventional in multilayer printed circuit boards. Other approaches to manufacturing a multilayered backplane may be employed. Additional conductive paths may be provided in this manner. For example, in one exemplary embodiment (not depicted) the electrical traces may be an integral part of the PCB backplate. In this embodiment, the electrical traces may be embedded in the PCB backplate by conventional multilayering of the PCB backplate 1228. These electrical traces can be configured in many ways, including, but not limited to, the electrical traces being in electrical communication vias and/or the electrical pads. In addition, the electrical traces 1240 can be in electrical communication with individual modulators or in direct electrical communication with the entire array or subportions thereof.

In the embodiment depicted in FIG. 17B, a desiccant 1254 is positioned between the array 1210 of optical modulators and the backplate 1228. The recessed portion of the backplate 1228 offers increased clearance for the desiccant 1254 to be disposed in the cavity 1250 without interfering with the operation of the array 1210.

The desiccant 1254 may have different shapes, forms, and sizes and may be applied in different ways. In the embodiment shown in FIG. 17B, this desiccant 1254 comprises a sheet that is mounted to the backplate 1228 with adhesive. Specifically, the desiccant 1254 is adhered to the central region 1230 of the backplate 1228. Advantageously, the recess created by the curvature of the front side of the backplate 1228 provides space for the desiccant 1254 above the modulator array 1210.

The package structure 1200 enhances performance of the modulators in multiple ways as well. Integration of electrical busses 1240 on the outside of the package structure 1200 offer a wide range of design possibilities that may enable enhancements of the performance of the array 1210 or provide additional features. For example, electrical busses can be arranged such that one end of the bus connects to one end of a row or column electrode within the array, and the other end of the bus connects to the other end of the same row or column electrode. This connection adds a parallel conduction path to the row or column, reducing the overall resistance of the row or column.

Advantageously, the conductive busses 1240 provide a relatively high conductivity connection to the array 1210 of optical modulators. The conductive busses 1240 can be fabricated with larger dimensions (e.g., width and thickness) than the electrodes that connect the modulators in the array 1210. This enhanced conductivity and, thus, reduced impedance, allows the optical modulators in the array 1210 to be driven faster. In addition, since the conductive busses 1240 are outside of the package if they are mounted on the outer surface 1232 of the package structure 1200, precious real estate within the cavity 1250 where the array 1210 of modulators is located, is not sacrificed. Interference with the mechanical operation of the array 1210 of interferometric modulators is also avoided. The package structure 1200 may also afford other advantages are not specifically recited herein.

Other configurations of the conductive busses 1240 may be utilized in other embodiments. For example, the conductive busses 1240 may follow different pathways and may be connected differently. The specific geometry may be altered depending on the designs or desired function. For example, in one exemplary embodiment (not depicted), a portion of the holes 1234 are placed on the domed region 1230 of the backplate 1228 and the conductive busses 1240 are in electrical communication with at least a portion of the modulators in the array 1210 that are below the respective holes 1234. This embodiment may be useful for performing testing on certain portions of the array 1210.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A display for an electronic device, comprising:
   a first transparent substrate;
   a first array of interferometric modulators supported by said first transparent substrate and configured to reflect light through said first transparent substrate and in a first direction;
   a backplate sealed to said first transparent substrate and providing a cavity for said first array of interferometric modulators and
   a second transparent substrate sealed to said backplate, wherein said second transparent substrate comprises a second array of interferometric modulators supported by said second transparent substrate and configured to reflect light in a second direction, and wherein said first direction and said second direction are opposite directions.

2. The display of claim 1, wherein the surface area of said first transparent substrate is substantially less than the surface area of said second transparent substrate.

3. The display of claim 2, wherein said backplate comprises an annular backplate.

4. The display of claim 3, wherein at least some of said electronic components are located on the same side of the backplate as said first transparent substrate.

5. The display of claim 1, wherein said backplate comprises electronic circuitry configured to control the states of said first and second arrays of interferometric modulators.

6. The display of claim 1, wherein said backplate comprises a printed circuit board.

7. The display of claim 6, additionally comprising a vapor barrier on said backplate.

8. The display of claim 7, additionally comprising a layer of desiccant within the cavity.

9. The display of claim 1, wherein said first transparent substrate comprises glass.

10. The display of claim 1, wherein said first transparent substrate comprises a polymeric material.

11. A display for an electronic device, comprising:
    a first transparent substrate;
    a first array of interferometric modulators supported by the first transparent substrate and configured to reflect light through said first transparent substrate and in a first direction;
    a backplate sealed to said first transparent substrate and providing a cavity for said first array of interferometric modulators, wherein said backplate comprises electronic circuitry configured to control said first array of interferometric modulators; and
    a second transparent substrate sealed to said first backplane, wherein said second transparent substrate comprises a second array of interferometric modulators supported by said second transparent substrate and configured to reflect light in a second direction, and wherein said first direction and said second direction are opposite directions.

12. The device of claim 11, wherein said first array of interferometric modulators is smaller than said second array of interferometric modulators, and at least some of said electronic circuitry is located within the protective cavity.

13. The display of claim 11, wherein said first transparent substrate comprises glass.

14. The display of claim 11, wherein said first transparent substrate comprises a polymeric material.

15. The display of claim 11, additionally comprising a vapor barrier on said backplate.

16. The display of claim 11, additionally comprising a layer of desiccant within the cavity.

17. A device having a display, comprising:
    a first transparent substrate;
    a first array of interferometric modulators supported by the first transparent substrate and configured to reflect light through said first transparent substrate;
    a second transparent substrate opposed to said first transparent substrate; and
    a second array of interferometric modulators supported by the second transparent substrate and configured to reflect light through said second transparent substrate.

18. The device of claim 17, wherein said first array is smaller than said second array.

19. The device of claim 18, wherein the surface area of said first transparent substrate is less than the surface area of said second transparent substrate.

20. The device of claim 19, additionally comprising an annular carrier, wherein said first transparent substrate is sealed to said annular carrier.

21. A method of manufacturing a display, comprising:
    providing a first transparent substrate supporting a first array of interferometric modulators;
    providing a second transparent substrate supporting a second array of interferometric modulators;
    providing a backplate comprising electronic circuitry configured to control the state of said first and second arrays of interferometric modulators;
    sealing said first transparent substrate to a first side of said backplate;
    sealing said second transparent substrate to a second side of said backplate; and
    placing said electronic circuitry in electrical connection with said first and second arrays of interferometric modulators.

22. The method of claim 21, wherein said first transparent substrate comprises glass.

23. The method of claim 21, wherein said first transparent substrate comprises a polymeric material.

24. The method of claim 21, wherein said backplate comprises a printed circuit board.

25. A display made by the process of claim 21.

26. A display, said display comprising:
- a first means for modulating light and reflecting it towards a viewer;
- a first means for supporting said first modulating means, wherein light reflected by said first modulating means is reflected through said first supporting means;
- a second means for modulating light and reflecting it towards a viewer;
- a second means for supporting said second modulating means, wherein light reflected by said second modulating means is reflected through said second supporting means, and wherein said first modulating means and said second modulating means reflect light in substantially opposite directions;
- means for controlling the state of said first and second modulation means; and
- a third means for supporting said controlling means.

27. The display of claim 26, wherein the first modulating means comprises a first array of interferometric modulators, and the second modulating means comprises a second array of interferometric modulators.

28. The display of claim 27, wherein the first supporting means comprises a first transparent substrate supporting the first array of interferometric modulators and the second supporting means comprises a second transparent substrate supporting the second array of interferometric modulators.

29. The display of claim 28, wherein the third supporting means comprises a backplate, wherein said first transparent substrate is sealed to a first side of said backplate, and wherein said second transparent substrate is sealed to a second side of said backplate.

30. The display of claim 29, wherein the controlling means comprises electronic circuitry supported by the backplate configured to control the states of said first and second arrays of interferometric modulators.

\* \* \* \* \*